(12) United States Patent
Inubushi et al.

(10) Patent No.: US 10,964,341 B2
(45) Date of Patent: *Mar. 30, 2021

(54) MAGNETORESISTIVE EFFECT ELEMENT, MAGNETIC HEAD, SENSOR, HIGH-FREQUENCY FILTER, AND OSCILLATOR

(71) Applicant: TDK CORPORATION, Tokyo (JP)

(72) Inventors: Kazuumi Inubushi, Tokyo (JP); Katsuyuki Nakada, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/999,611

(22) Filed: Aug. 21, 2020

(65) Prior Publication Data
US 2020/0388302 A1 Dec. 10, 2020

Related U.S. Application Data

(63) Continuation of application No. 16/565,955, filed on Sep. 10, 2019, now Pat. No. 10,783,906, which is a
(Continued)

(30) Foreign Application Priority Data

May 26, 2017 (JP) .............................. JP2017-104745

(51) Int. Cl.
*G11B 5/39* (2006.01)
*H01L 43/10* (2006.01)
(Continued)

(52) U.S. Cl.
CPC .......... *G11B 5/3906* (2013.01); *G01R 33/093* (2013.01); *G11B 5/3133* (2013.01);
(Continued)

(58) Field of Classification Search
None
See application file for complete search history.

(56) References Cited

U.S. PATENT DOCUMENTS 7,336,453 B2 2/2008 Hasegawa et al.
8,031,441 B2 10/2011 Zhang et al.
(Continued)

FOREIGN PATENT DOCUMENTS

| JP | 2012-190914 A | 10/2012 |
|---|---|---|
| JP | 6137577 B2 | 5/2017 |
| JP | 2017-097935 A | 6/2017 |

OTHER PUBLICATIONS

Hari S. Goripati et al.; "Bi-quadratic interlayer exchange coupling in Co2MnSi/Ag/Co2MnSi pseudo spin-valve"; Journal of Applied Physics 110; 123914 (2011); Dec. 2011; pp. 123914-1-123914-7.
(Continued)

*Primary Examiner* — William J Klimowicz
(74) *Attorney, Agent, or Firm* — Oliff PLC

(57) ABSTRACT

A nonmagnetic spacer layer in a magnetoresistive effect element includes a nonmagnetic metal layer that is formed of Ag and at least one of a first insertion layer that is disposed on a bottom surface of the nonmagnetic metal layer and a second insertion layer that is disposed on a top surface of the nonmagnetic metal layer. The first insertion layer and the second insertion layer include an Fe alloy that is expressed by $Fe_{\gamma}X_{1-\gamma}$. Here, X denotes one or more elements selected from a group consisting of O, Al, Si, Ga, Mo, Ag, and Au, and $\gamma$ satisfies $0<\gamma<1$.

20 Claims, 20 Drawing Sheets

EXAMPLE B GROUP

| $\alpha + \beta$ | $\alpha$ (Mn) | $\beta$ (Si) | FERROMAGNETIC LAYER | INSERTION LAYER | THICKNESS OF INSERTION LAYER(nm) | STANDARDIZED MR RATIO |
|---|---|---|---|---|---|---|
| 1.85 | 1.3 | 0.55 | Co2Mn1.3Si0.55 | Fe0.75Al0.25 | 0.5 | 4.9 |
| 1.95 | 1.3 | 0.65 | Co2Mn1.3Si0.65 | Fe0.75Al0.25 | 0.5 | 6.9 |
| 2.05 | 1.3 | 0.75 | Co2Mn1.3Si0.75 | Fe0.75Al0.25 | 0.5 | 12.4 |
| 2.15 | 1.3 | 0.85 | Co2Mn1.3Si0.85 | Fe0.75Al0.25 | 0.5 | 14.2 |
| 2.25 | 1.3 | 0.95 | Co2Mn1.3Si0.95 | Fe0.75Al0.25 | 0.5 | 15.8 |
| 2.35 | 1.3 | 1.05 | Co2Mn1.3Si1.05 | Fe0.75Al0.25 | 0.5 | 16.3 |
| 2.45 | 1.3 | 1.15 | Co2Mn1.3Si1.15 | Fe0.75Al0.25 | 0.5 | 17.2 |
| 2.55 | 1.3 | 1.25 | Co2Mn1.3Si1.25 | Fe0.75Al0.25 | 0.5 | 18.0 |
| 2.65 | 1.3 | 1.35 | Co2Mn1.3Si1.35 | Fe0.75Al0.25 | 0.5 | 8.8 |
| 2.75 | 1.3 | 1.45 | Co2Mn1.3Si1.45 | Fe0.75Al0.25 | 0.5 | 7.6 |

Related U.S. Application Data continuation of application No. 15/988,707, filed on May 24, 2018, now Pat. No. 10,453,482.

(51) Int. Cl.
  *G01R 33/09* (2006.01)
  *H03B 15/00* (2006.01)
  *H01L 43/12* (2006.01)
  *H01L 43/08* (2006.01)
  *G11B 5/31* (2006.01)
  *H03H 2/00* (2006.01)

(52) U.S. Cl.
  CPC .............. *H01L 43/08* (2013.01); *H01L 43/10* (2013.01); *H01L 43/12* (2013.01); *H03B 15/006* (2013.01); *H03H 2/00* (2013.01)

(56) References Cited

U.S. PATENT DOCUMENTS

| | | |
|---|---|---|
| 10,453,482 B2 | 10/2019 | Inubushi et al. |
| 10,453,598 B2 | 10/2019 | Inubushi et al. |
| 2003/0168673 A1 | 9/2003 | Yuasa et al. |
| 2008/0278864 A1 | 11/2008 | Zhang et al. |
| 2012/0009337 A1 | 1/2012 | Zhang et al. |
| 2013/0242435 A1 | 9/2013 | Fuji et al. |
| 2016/0019917 A1 | 1/2016 | Du et al. |
| 2017/0092307 A1 | 3/2017 | Du et al. |
| 2019/0006074 A1* | 1/2019 | Inubushi ............... H01F 10/329 |
| 2019/0181334 A1* | 6/2019 | Inubushi ............. H01F 10/1936 |
| 2019/0392972 A1 | 12/2019 | Inubushi et al. |
| 2020/0303634 A1* | 9/2020 | Inubushi ............. H01F 10/1936 |

OTHER PUBLICATIONS

T. Furubayashi et al; "Structure and transport properties of current-perpendicular-to-plane spin valves usin Co 2FeAl 0.5 Si 0.5 and Co 2 MnSi Heusler alloy electrodes"; Journal of Applid Physics 107; 113917 (2010); Jun. 2010; pp. 113917-1-113917-7.

Apr. 23, 2019 Office Action issued in U.S. Appl. No. 15/988,707.
Jan. 9, 2019 Office Action issued in U.S. Appl. No. 15/988,707.

\* cited by examiner

Fig.2 (COMPARATIVE EXAMPLE)

Fig. 3

| | Y | | | | | | |
|---|---|---|---|---|---|---|---|
| | 0.5 | 0.55 | 0.6 | 0.7 | 0.8 | 0.9 | 0.95 |
| $Fe_Y O_{1-Y}$ | 1.0 | 1.3 | 2.7 | 3.3 | 3.1 | 2.7 | 1.5 |
| $Fe_Y Al_{1-Y}$ | | 2.8 | 4.0 | 4.5 | 4.5 | 3.9 | 2.4 |
| $Fe_Y Si_{1-Y}$ | | 2.9 | 3.9 | 4.1 | 4.7 | 4.0 | 2.3 |
| $Fe_Y Ga_{1-Y}$ | | 2.4 | 4.0 | 4.6 | 4.3 | 3.9 | 2.2 |
| $Fe_Y Mo_{1-Y}$ | | 1.8 | 3.6 | 3.9 | 3.6 | 3.3 | 1.5 |
| $Fe_Y Ag_{1-Y}$ | 2.7 | 2.7 | 3.0 | 3.1 | 3.0 | 3.1 | 2.5 |
| $Fe_Y Au_{1-Y}$ | 2.2 | 2.5 | 3.1 | 3.4 | 3.3 | 3.0 | 2.3 |

Fig. 5

| | α + β | α (Mn) | β (Si) | FERROMAGNETIC LAYER | INSERTION LAYER | THICKNESS OF INSERTION LAYER (nm) | STANDARDIZED MR RATIO |
|---|---|---|---|---|---|---|---|
| COMPARATIVE EXAMPLE 1 | — | — | — | Co$_{0.5}$Fe$_{0.5}$ | NONE | NONE | 1.0 |
| EXAMPLE 1 | — | — | — | Co$_{0.5}$Fe$_{0.5}$ | Fe$_{0.2}$Au$_{0.8}$ | 0.5 | 3.0 |
| EXAMPLE 2 | — | — | — | Co$_{0.5}$Fe$_{0.5}$ | Fe$_{0.65}$Au$_{0.35}$ | 0.5 | 4.5 |
| EXAMPLE 3 | 1.92 | 1 | 0.92 | Co$_2$Mn$_{1.0}$Si$_{0.92}$ | Fe$_{0.65}$Au$_{0.35}$ | 0.5 | 10.2 |
| EXAMPLE 4 | 1.92 | 1 | 0.92 | Co$_2$Mn$_{1.0}$Si$_{0.92}$ | Fe$_{0.75}$Au$_{0.25}$ | 0.5 | 13.1 |
| EXAMPLE 5 | 2.22 | 1.3 | 0.92 | Co$_2$Mn$_{1.3}$Si$_{0.92}$ | Fe$_{0.75}$Au$_{0.25}$ | 0.5 | 16.0 |

Fig.6

EXAMPLE A GROUP

| α+β | α(Mn) | β(Si) | FERROMAGNETIC LAYER | INSERTION LAYER | THICKNESS OF INSERTION LAYER(nm) | STANDARDIZED MR RATIO |
|---|---|---|---|---|---|---|
| 1.4 | 0.45 | 0.95 | Co2Mn0.45Si0.95 | Fe0.75Al0.25 | 0.5 | 1.1 |
| 1.6 | 0.65 | 0.95 | Co2Mn0.65Si0.95 | Fe0.75Al0.25 | 0.5 | 1.3 |
| 1.8 | 0.85 | 0.95 | Co2Mn0.85Si0.95 | Fe0.75Al0.25 | 0.5 | 10.1 |
| 2 | 1.05 | 0.95 | Co2Mn1.05Si0.95 | Fe0.75Al0.25 | 0.5 | 15.0 |
| 2.1 | 1.15 | 0.95 | Co2Mn1.15Si0.95 | Fe0.75Al0.25 | 0.5 | 16.1 |
| 2.2 | 1.25 | 0.95 | Co2Mn1.25Si0.95 | Fe0.75Al0.25 | 0.5 | 17.5 |
| 2.3 | 1.35 | 0.95 | Co2Mn1.35Si0.95 | Fe0.75Al0.25 | 0.5 | 17.7 |
| 2.4 | 1.45 | 0.95 | Co2Mn1.45Si0.95 | Fe0.75Al0.25 | 0.5 | 18.3 |
| 2.5 | 1.55 | 0.95 | Co2Mn1.55Si0.95 | Fe0.75Al0.25 | 0.5 | 17.9 |
| 2.6 | 1.65 | 0.95 | Co2Mn1.65Si0.95 | Fe0.75Al0.25 | 0.5 | 6.6 |
| 2.7 | 1.75 | 0.95 | Co2Mn1.75Si0.95 | Fe0.75Al0.25 | 0.5 | 4.6 |

Fig.7

EXAMPLE B GROUP

| α+β | α (Mn) | β (Si) | FERROMAGNETIC LAYER | INSERTION LAYER | THICKNESS OF INSERTION LAYER(nm) | STANDARDIZED MR RATIO |
|---|---|---|---|---|---|---|
| 1.85 | 1.3 | 0.55 | Co$_2$Mn$_{1.3}$Si$_{0.55}$ | Fe$_{0.75}$Al$_{0.25}$ | 0.5 | 4.9 |
| 1.95 | 1.3 | 0.65 | Co$_2$Mn$_{1.3}$Si$_{0.65}$ | Fe$_{0.75}$Al$_{0.25}$ | 0.5 | 6.9 |
| 2.05 | 1.3 | 0.75 | Co$_2$Mn$_{1.3}$Si$_{0.75}$ | Fe$_{0.75}$Al$_{0.25}$ | 0.5 | 12.4 |
| 2.15 | 1.3 | 0.85 | Co$_2$Mn$_{1.3}$Si$_{0.85}$ | Fe$_{0.75}$Al$_{0.25}$ | 0.5 | 14.2 |
| 2.25 | 1.3 | 0.95 | Co$_2$Mn$_{1.3}$Si$_{0.95}$ | Fe$_{0.75}$Al$_{0.25}$ | 0.5 | 15.8 |
| 2.35 | 1.3 | 1.05 | Co$_2$Mn$_{1.3}$Si$_{1.05}$ | Fe$_{0.75}$Al$_{0.25}$ | 0.5 | 16.3 |
| 2.45 | 1.3 | 1.15 | Co$_2$Mn$_{1.3}$Si$_{1.15}$ | Fe$_{0.75}$Al$_{0.25}$ | 0.5 | 17.2 |
| 2.55 | 1.3 | 1.25 | Co$_2$Mn$_{1.3}$Si$_{1.25}$ | Fe$_{0.75}$Al$_{0.25}$ | 0.5 | 18.0 |
| 2.65 | 1.3 | 1.35 | Co$_2$Mn$_{1.3}$Si$_{1.35}$ | Fe$_{0.75}$Al$_{0.25}$ | 0.5 | 8.8 |
| 2.75 | 1.3 | 1.45 | Co$_2$Mn$_{1.3}$Si$_{1.45}$ | Fe$_{0.75}$Al$_{0.25}$ | 0.5 | 7.6 |

Fig. 11

EXAMPLE C GROUP

| α + β | α (Mn) | β (Si) | FERROMAGNETIC LAYER | INSERTION LAYER | THICKNESS OF INSERTION LAYER (nm) | STANDARDIZED MR RATIO |
|---|---|---|---|---|---|---|
| 2.22 | 1.3 | 0.92 | Co2Mn1.3Si0.92 | Fe0.75Al0.25 | 0.1 | 4.9 |
| 2.22 | 1.3 | 0.92 | Co2Mn1.3Si0.92 | Fe0.75Al0.25 | 0.2 | 10 |
| 2.22 | 1.3 | 0.92 | Co2Mn1.3Si0.92 | Fe0.75Al0.25 | 0.5 | 16.0 |
| 2.22 | 1.3 | 0.92 | Co2Mn1.3Si0.92 | Fe0.75Al0.25 | 1 | 13.8 |
| 2.22 | 1.3 | 0.92 | Co2Mn1.3Si0.92 | Fe0.75Al0.25 | 2 | 14.6 |
| 2.22 | 1.3 | 0.92 | Co2Mn1.3Si0.92 | Fe0.75Al0.25 | 5 | 11.6 |
| 2.22 | 1.3 | 0.92 | Co2Mn1.3Si0.92 | Fe0.75Al0.25 | 8 | 9.9 |
| 2.22 | 1.3 | 0.92 | Co2Mn1.3Si0.92 | Fe0.75Al0.25 | 10 | 6.0 |
| 2.22 | 1.3 | 0.92 | Co2Mn1.3Si0.92 | Fe0.75Al0.25 | 12 | 2.1 |
| 2.22 | 1.3 | 0.92 | Co2Mn1.3Si0.92 | Fe0.75Al0.25 | 15 | 1.4 |

Fig.13

| | a | a×√2 | STRUCTURE TYPE | Pearson Symbol |
|---|---|---|---|---|
| Ag | 0.41 | 0.579828(*) | Cu | cF4 |
| Fe$_{0.5}$O$_{0.5}$ | 0.43109 | 0.609653(*) | NaCl | cF8 |
| Fe$_{0.1}$Al$_{0.9}$ | 0.404 | 0.571342(*) | Cu | cF4 |
| Fe$_{0.75}$Al$_{0.25}$ | 0.579(*) | 0.81883 | BiF$_3$ | cF16 |
| Fe$_{0.75}$Si$_{0.25}$ | 0.56(*) | 0.79196 | BiF$_3$ | cF16 |
| Fe$_{0.75}$Ga$_{0.25}$ | 0.5807(*) | 0.821234 | BiF$_3$ | cF16 |
| Mo$_{0.73}$Fe$_{0.27}$ | 0.386 | 0.545886(*) | Cu | cF4 |
| Ag$_{0.5}$Fe$_{0.5}$ | 0.403 | 0.569928(*) | Cu | cF4 |
| Au$_{0.5}$Fe$_{0.5}$ | 0.3946 | 0.558049(*) | Cu | cF4 |

VALUE WITH MARK (*) IS USED TO CALCULATE LATTICE CONSTANT DIFFERENCE

Fig. 14

| | Co2MnSi | Co2MnGe | Co2MnGa | Co2FeGa | Co2FeSi | Co2MnSn | Co2MnAl | Co2FeAl |
|---|---|---|---|---|---|---|---|---|
| a | 0.5606 | 0.5711 | 0.577 | 0.5677 | 0.5658 | 0.5982 | 0.5664 | 0.573 |

| | Co2CrAl | Co2VAl | Co2MnGa0.5Sn0.5 | Co2FeGeGa |
|---|---|---|---|---|
| a | 0.589 | 0.58 | 0.587 | 0.574 |

Fig. 15

| | Co2MnSi | Co2MnGe | Co2MnGa | Co2FeGa | Co2FeSi | Co2MnSn | Co2MnAl | Co2FeAl |
|---|---|---|---|---|---|---|---|---|
| Ag | 0.0343 | 0.0153 | 0.0049 | 0.0214 | 0.0248 | -0.0307 | 0.0237 | 0.0119 |
| Fe0.5O0.5 | 0.0875 | 0.0675 | 0.0566 | 0.0739 | 0.0775 | 0.0191 | 0.0764 | 0.0640 |
| Fe0.1Al0.9 | 0.0192 | 0.0004 | -0.0098 | 0.0064 | 0.0098 | -0.0449 | 0.0087 | -0.0029 |
| Fe0.75Al0.25 | 0.0328 | 0.0138 | 0.0035 | 0.0199 | 0.0233 | -0.0321 | 0.0222 | 0.0105 |
| Fe0.75Si0.25 | -0.0011 | -0.0194 | -0.0295 | -0.0136 | -0.0103 | -0.0639 | -0.0113 | -0.0227 |
| Fe0.75Ga0.25 | 0.0359 | 0.0168 | 0.0064 | 0.0229 | 0.0263 | -0.0293 | 0.0252 | 0.0134 |
| Mo0.73Fe0.27 | -0.0262 | -0.0441 | -0.0539 | -0.0384 | -0.0352 | -0.0875 | -0.0362 | -0.0473 |
| Ag0.5Fe0.5 | 0.0166 | -0.0021 | -0.0123 | 0.0039 | 0.0073 | -0.0473 | 0.0062 | -0.0054 |
| Au0.5Fe0.5 | -0.0046 | -0.0229 | -0.0328 | -0.0170 | -0.0137 | -0.0671 | -0.0147 | -0.0261 |

|  | Co2CrAl | Co2VAl | Co2MnGa0.5Sn0.5 | Co2FeGeGa |
|---|---|---|---|---|
| Ag | -0.0156 | -0.0003 | -0.0122 | 0.0102 |
| Fe0.5O0.5 | 0.0351 | 0.0511 | 0.0386 | 0.0621 |
| Fe0.1Al0.9 | -0.0300 | -0.0149 | -0.0267 | -0.0046 |
| Fe0.75Al0.25 | -0.0170 | -0.0017 | -0.0136 | 0.0087 |
| Fe0.75Si0.25 | -0.0492 | -0.0345 | -0.0460 | -0.0244 |
| Fe0.75Ga0.25 | -0.0141 | 0.0012 | -0.0107 | 0.0117 |
| Mo0.73Fe0.27 | -0.0732 | -0.0588 | -0.0700 | -0.0490 |
| Ag0.5Fe0.5 | -0.0324 | -0.0174 | -0.0291 | -0.0071 |
| Au0.5Fe0.5 | -0.0525 | -0.0378 | -0.0493 | -0.0278 |

Fig.16

MAGNETORESISTIVE EFFECT ELEMENT, MAGNETIC HEAD, SENSOR, HIGH-FREQUENCY FILTER, AND OSCILLATOR

CROSS-REFERENCE TO RELATED APPLICATIONS

This is a Continuation of application Ser. No. 16/565,955, filed Sep. 10, 2019, which is a Continuation of application Ser. No. 15/988,707 filed May 24, 2018, which in turn claims the benefit of priority from Japanese Patent Application No. 2017-104745, filed May 26, 2017. The disclosure of the prior application is hereby incorporated by reference herein in its entirety.

TECHNICAL FIELD

The invention relates to a magnetoresistive effect element and also relates to a magnetic head, a sensor, a high-frequency filter, and an oscillator using the magnetoresistive effect element.

BACKGROUND

A giant magnetoresistive (GMR) effect element in the related art includes a first ferromagnetic layer serving as a magnetization fixed layer, a second ferromagnetic layer serving as a magnetization free layer, and a nonmagnetic spacer layer that is disposed between the first ferromagnetic layer and the second ferromagnetic layer. That is, a GMR effect element has a structure of ferromagnetic layer/nonmagnetic spacer layer/ferromagnetic layer. The GMR effect element can allow electrons having a spin to pass therethrough in a state in which the magnetization directions of the upper and lower ferromagnetic layers are aligned. A current-perpendicular-to-the plane (CPP) GMR effect element in the related art has a smaller magnetoresistive effect than a tunneling magnetoresistive (TMR) effect element. Accordingly, in a GMR effect element disclosed in Patent Reference 1, a Heusler alloy (Co$_2$(Fe, Mn)Si) is used for the ferromagnetic layers and Ag is used for the nonmagnetic spacer layer, whereby improvement in a magnetoresistive effect is attempted.

Japanese Patent Laid-Open Application No. 2012-190914.

SUMMARY

However, according to the knowledge of the inventors of the invention, the magnetoresistive effect in a magnetoresistive effect element in which a Heusler alloy and a nonmagnetic metal are simply combined is not satisfactory.

The invention is made in consideration of the above-mentioned problem and an object thereof is to provide a magnetoresistive effect element with an improved magnetoresistive effect.

In order to achieve the above-mentioned object, there is provided a first magnetoresistive effect element including: a first ferromagnetic layer that serves as a magnetization fixed layer; a second ferromagnetic layer that serves as a magnetization free layer; and a nonmagnetic spacer layer that is disposed between the first ferromagnetic layer and the second ferromagnetic layer, wherein the nonmagnetic spacer layer includes a nonmagnetic metal layer that is formed of Ag, and at least one of a first insertion layer that is disposed on a bottom surface of the nonmagnetic metal layer and a second insertion layer that is disposed on a top surface of the nonmagnetic metal layer, and wherein the first insertion layer and the second insertion layer include an Fe alloy that is expressed by General Formula (1):

$$Fe_\gamma X_{1-\gamma} \quad (1)$$

(where X denotes one or more elements selected from a group consisting of O, Al, Si, Ga, Mo, Ag, and Au, and $\gamma$ satisfies $0<\gamma<1$).

In this case, since lattice matching between one insertion layer including an Fe alloy and the nonmagnetic metal layer including Ag is enhanced and lattice matching with the ferromagnetic layer located outside the insertion layer can be enhanced, a magnetoresistive effect is improved.

In a second magnetoresistive effect element, $\gamma$ in General Formula (1) may satisfy $0.6 \leq \gamma \leq 0.9$. In this case, when the content of Fe in the Fe alloy is within the above-mentioned range ($0.6 \leq \gamma \leq 0.9$), the MR ratio is higher than when the content of Fe is outside of this range.

In a third magnetoresistive effect element, at least one of the first ferromagnetic layer and the second ferromagnetic layer may include a Heusler alloy that is expressed by General formula (2):

$$Co_2L_\alpha M_\beta \quad (2)$$

(where L denotes one or more elements selected from a group consisting of Mn and Fe, M denotes one or more elements selected from a group consisting of Si, Al, Ga, and Ge, $0.7 \leq \alpha \leq 1.6$ is satisfied, and $0.65 \leq \beta \leq 1.35$).

In a fourth magnetoresistive effect element, X in General formula (1) may be one or more elements selected from a group consisting of Al, Si, and Ga. When such an element and an Fe alloy are used, it is possible to achieve a high MR ratio.

In a fifth magnetoresistive effect element, $\alpha$ and $\beta$ in General formula (2) may satisfy $2 \leq \alpha+\beta \leq 2.6$. In this range ($2\alpha+\beta \leq 2.6$), it is possible to acquire a high MR ratio. When $\alpha$ and $\beta$ in General formula (2) satisfy $0.85 \leq \alpha \leq 1.55$, $0.75 \leq \beta \leq 1.25$, and $2 \leq \alpha+\beta 2.55$, it is possible to achieve a high MR ratio.

In the magnetoresistive effect element, $0.2 \text{ nm} \leq t1 \leq 10 \text{ nm}$ may be satisfied where t1 denotes a thickness of the first insertion layer, and $0.2 \text{ nm} \leq t2 \leq 10 \text{ nm}$ may be satisfied where t2 denotes a thickness of the second insertion layer. In this case, it is possible to achieve a high MR ratio.

Preferably, when $0.5 \text{ nm} \leq t1 \leq 8 \text{ nm}$ and $0.5 \text{ nm} \leq t2 \leq 8 \text{ nm}$ are satisfied, it is possible to achieve a high MR ratio.

A magnetic head, a sensor, a high-frequency filter, and an oscillator that include the above-mentioned magnetoresistive effect element have a large magnetoresistive effect and thus excellent characteristics due to the magnetresistive effect can be exhibited.

With the magnetoresistive effect element according to the invention, it is possible to improve a magnetoresistive effect.

BRIEF DESCRIPTION OF THE DRAWINGS

FIG. 3 is a table illustrating a relationship between an Fe content $\gamma$ in an insertion layer formed of $Fe_\gamma X_{1-\gamma}$ and a standardized MR ratio;

FIG. 5 is a table illustrating a standardized MR ratio and the like in GMR effect elements (a comparative example and Examples 1 to 5) when various materials are used;

FIG. 6 is a table illustrating a standardized MR ratio and the like in GMR effect elements (Example A group) when various materials are used;

FIG. 7 is a table illustrating a standardized MR ratio and the like in GMR effect elements (Example B group) when various materials are used;

FIG. 11 is a table illustrating a thickness of an insertion layer, a standardized MR ratio, and the like when materials of Example C group are used;

FIG. 13 is a table illustrating lattice constants, structure types, and Pearson symbols of Ag and Fe alloys;

FIG. 14 is a table illustrating a lattice constant of various Heusler alloys;

FIG. 15 is a table illustrating a lattice mismatching ratio between an Ag or Fe alloy and various Heusler alloys;

FIG. 16 is a table illustrating a lattice mismatching ratio between an Ag or Fe alloy and various Heusler alloys;

DETAILED DESCRIPTION

Hereinafter, a magnetoresistive effect element according to an embodiment of the invention will be described. The same elements will be referenced by the same reference signs and description thereof will not be repeated. When a three-dimensional orthogonal coordinate system is used, a thickness direction of each layer is defined as a Z axis and two orthogonal axes perpendicular to the Z axis are defined as an X axis and a Y axis.

Figure 1:
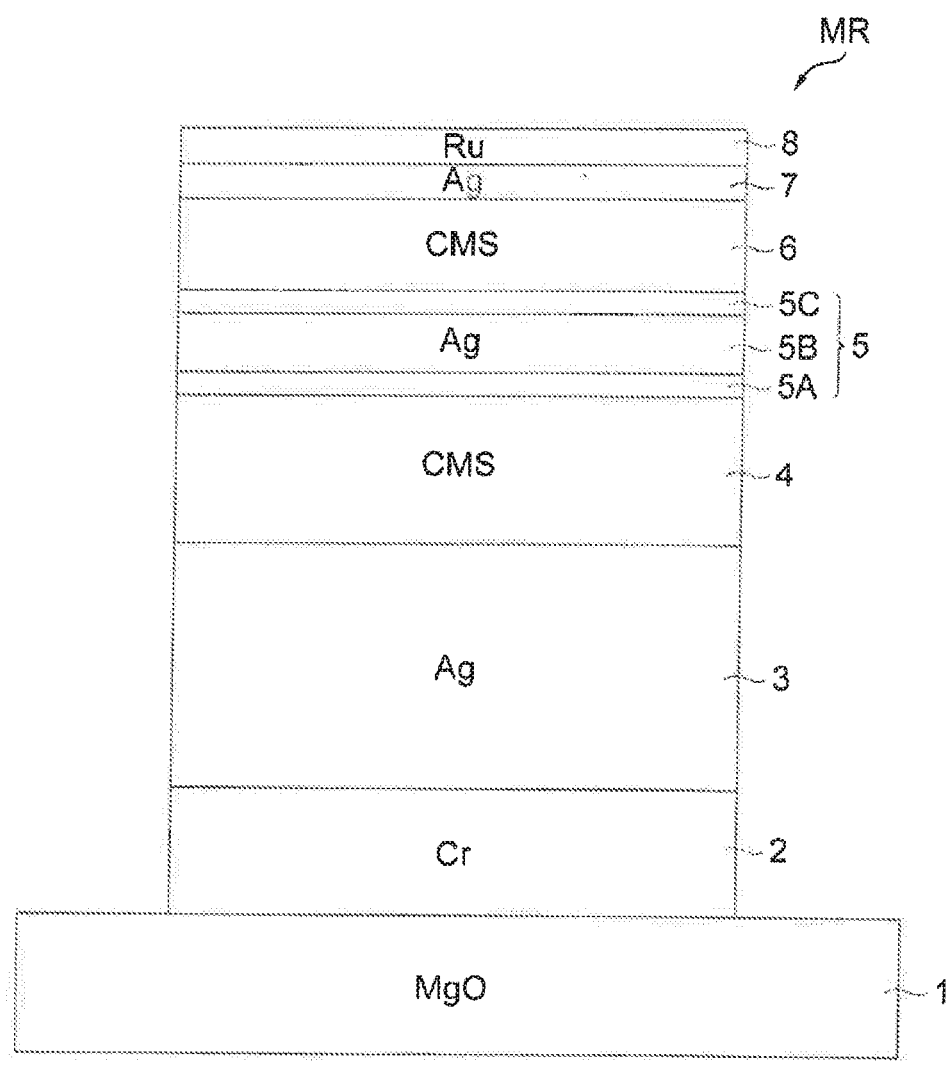
FIG. 1 is a front view of a magnetoresistive effect element MR according to an example.

FIG. 1 is a front view of a magnetoresistive effect element MR according to an example.

A magnetoresistive effect element MR sequentially includes a first nonmagnetic metal layer 2, and a second nonmagnetic metal layer 3 on a first base layer 1. Thereon, a first ferromagnetic layer 4 serving as a magnetization fixed layer, a nonmagnetic spacer layer 5, and a second ferromagnetic layer 6 serving as a magnetization free layer are sequentially stacked. A cap nonmagnetic metal layer 7 and a contact metal layer 8 are sequentially formed on the second ferromagnetic layer 6. When a bias is applied between the first nonmagnetic metal layer 2 or the second nonmagnetic metal layer 3 located in the lower part and the contact metal layer 8 located in the upper part, electrons having a spin in a specific direction can be allowed to pass therethrough in a direction perpendicular to a layer surface.

When magnetization directions in the magnetization fixed layer and the magnetization free layer are the same direction (for example, the +X direction and the +X direction) (parallel), electrons of which the spin direction is parallel thereto pass through the layer surfaces in the perpendicular direction. When the magnetization directions in the magnetization fixed layer and the magnetization free layer are opposite to each other (for example, the +X direction and the −X direction) (antiparallel), electrons having a spin of which the direction is opposite to the magnetization direction are reflected and do not pass through the layer surfaces.

Since the magnetization direction of the first ferromagnetic layer 4 (the magnetization fixed layer) is fixed and the magnetization direction of the second ferromagnetic layer 6 (the magnetization free layer) can be changed depending on an external magnetic field, an amount of electrons passing through varies depending on the magnitude of the external magnetic field. A resistance is low when the amount of electrons passing through is large, and a resistance is high when the amount of electrons passing through is small. Since the first ferromagnetic layer 4 serving as the magnetization fixed layer has a thickness larger than that of the second ferromagnetic layer 6 and the magnetization direction thereof is less likely to be changed depending on the external magnetic field than that of the second ferromagnetic layer 6, the first ferromagnetic layer 4 serves as a magnetization fixed layer in which the magnetization direction is substantially fixed.

In FIG. 1, representative material names are shown in the layers for the purpose of easy understanding, but other materials are applicable to the layers.

The nonmagnetic spacer layer 5 is disposed between the first ferromagnetic layer 4 and the second ferromagnetic layer 6. The nonmagnetic spacer layer 5 includes a nonmagnetic metal layer 5B formed of Ag and at least one of a first insertion layer 5A disposed on the bottom surface of the nonmagnetic metal layer 5B and a second insertion layer 5C disposed on the top surface of the nonmagnetic metal layer 5B. That is, a structure in which one of the first insertion layer 5A and the second insertion layer 5C is omitted and the central nonmagnetic metal layer 5B comes in contact with one of the upper and lower ferromagnetic layers may be employed.

The first insertion layer 5A and the second insertion layer 5C include an Fe alloy which is expressed by General formula (1).

$$Fe_{\gamma}X_{1-\gamma} \tag{1}$$

Here, X denotes one or more elements selected from a group consisting of O, Al, Si, Ga, Mo, Ag, and Au, and y satisfies $0<\gamma<1$.

That is, in addition to Fe alloys which are combinations such as Fe—O, Fe—Al, Fe—Si, Fe—Ga, Fe—Mo, Fe—Ag, and Fe—Au, Fe alloys such as Fe—Al—Si and Fe—Al—Mo which are close thereto in electrical properties and lattice constant of crystal structure can also be used.

In this case, since lattice matching between one insertion layer (the first insertion layer 5A or the second insertion layer 5C) including an Fe alloy and the nonmagnetic metal layer 5B including Ag can be enhanced and lattice matching between the insertion layer (the first insertion layer 5A or the second insertion layer 5C) and the ferromagnetic layer (the first ferromagnetic layer 4 or the second ferromagnetic layer 6) located outside thereof can be enhanced, it is possible to improve a magnetoresistive effect.

Materials and thicknesses (suitable ranges) of the layers are as follows.

Contact metal layer 8: Ru, 5 nm, (range of 3 nm to 8 nm)
Cap nonmagnetic metal layer 7: Ag, 5 nm, (range of 3 nm to 8 nm)
Second ferromagnetic layer 6: CMS (cobalt-manganese-silicon alloy), 5 nm, (range of 3 nm to 20 nm)
Second insertion layer 5C: Fe alloy ($Fe_\gamma X_{1-\gamma}$ described above), 0.5 nm, (range of 0.2 nm to 10 nm)
Nonmagnetic metal layer 5B: Ag, 5 nm, (range of 3 nm to 10 nm)
First insertion layer 5A: Fe alloy ($Fe_\gamma X_{1-\gamma}$ described above), 0.5 nm, (range of 0.2 nm to 10 nm)
First ferromagnetic layer 4: CMS (a cobalt-manganese-silicon alloy), 10 nm, (range of 3 nm to 20 nm)
Second nonmagnetic metal layer 3: Ag, 50 nm, (range of 20 nm to 100 nm)
First nonmagnetic metal layer 2: Cr, 20 nm, (range of 10 nm to 30 nm)
First base layer 1: MgO, 0.5 mm, (range of 0.1 mm to 2 mm)

Examples of the materials of the layers constituting the magnetoresistive effect element will be described in more detail.

Ru can be suitably used for the contact metal layer 8, and the contact metal layer 8 may additionally include one or more metal elements from Ru, Ag, Al, Cu, Au, Cr, Mo, Pt, W, Ta, Pd, and Ir, an alloy of these metal elements, or a stacked structure of materials including two or more types of these metal elements.

Ag can be suitably used for the cap metal layer 7, and the cap metal layer 7 may additionally include one or more metal elements from Ru, Ag, Al, Cu, Au, Cr, Mo, Pt, W, Ta, Pd, and Ir, an alloy of these metal elements, or a stacked structure of materials including two or more types of these metal elements.

CMS ($Co_2L_\alpha M_\beta$) which is a Heusler alloy can be suitably used for the second ferromagnetic layer 6, and the second ferromagnetic layer 6 may include Heusler alloys such as $Co_2MnGe$, $Co_2MnGa$, $Co_2FeGa$, $Co_2FeSi$, $Co_2MnSn$, $Co_2MnAl$, $Co_2FeAl$, $Co_2CrAl$, $Co_2VAl$, $Co_2MnGaSn$, $Co_2FeGeGa$, $Co_2MnGeGa$, $Co_2FeGaSi$, $Co_2FeGeSi$, $Co_2CrIn$, and $Co_2CrSn$ or ferromagnetic materials such as $Fe_3O_4$, $CrO_2$, and CoFeB or may be substantially formed of these ferromagnetic materials. $Co_2L_\alpha M_\beta$ denotes that the proportion of the number of atoms of L constituting the whole alloy is $\alpha$ and the proportion of the number of atoms of M is $\beta$ when the number of atoms of Co is defined as two.

CMS ($Co_2L_\alpha M_\beta$) which is a Heusler alloy can be suitably used for the first ferromagnetic layer 4, and the first ferromagnetic layer 4 may include Heusler alloys such as $Co_2MnGe$, $Co_2MnGa$, $Co_2FeGa$, $Co_2FeSi$, $Co_2MnSn$, $Co_2MnAl$, $Co_2FeAl$, $Co_2CrAl$, $Co_2VAl$, $Co_2MnGaSn$, $Co_2FeGeGa$, $Co_2MnGeGa$, $Co_2FeGaSi$, $Co_2FeGeSi$, $Co_2CrIn$, and $Co_2CrSn$ or ferromagnetic materials such as $Fe_3O_4$, $CrO_2$, and CoFeB or may be substantially formed of these ferromagnetic materials.

Ag can be suitably used for the second nonmagnetic metal layer 3, and the second nonmagnetic metal layer 3 may include at least one metal element from, for example, Ag, Au, Cu, Cr, V, Al, W, and Pt, an alloy of these metal elements, or a stacked structure of materials including two or more types of these metal elements. Examples of an alloy of the metal elements include an AgZn alloy, an AgMg alloy, and a NiAl alloy of a cubic type.

Cr can be suitably used for the first nonmagnetic metal layer 2, and the first nonmagnetic metal layer 2 may include at least one metal element from, for example, Ag, Au, Cu, Cr, V, Al, W, and Pt, an alloy of these metal elements, or a stacked structure of materials including two or more types of these metal elements. Examples of an alloy of the metal elements include an AgZn alloy, an AgMg alloy, and a NiAl alloy of a cubic type.

MgO can be suitably used for the first base layer 1, and the material of the first base layer 1 is not particularly limited as long as it is a material having an appropriate mechanical strength and being suitable for heating or fine machining such as metal oxide single crystal substrates, silicon single crystal substrates, silicon single crystal substrates with a thermal oxide film, sapphire single crystal substrates, ceramics, quartz, and glass. With a substrate including MgO single crystal substrates, an epitaxial growth film is easily formed. Characteristics of high magnetoresistance can be exhibited with this epitaxial growth film.

The superiority of the above-mentioned structure to a comparative example will be described below.

Figure 2:
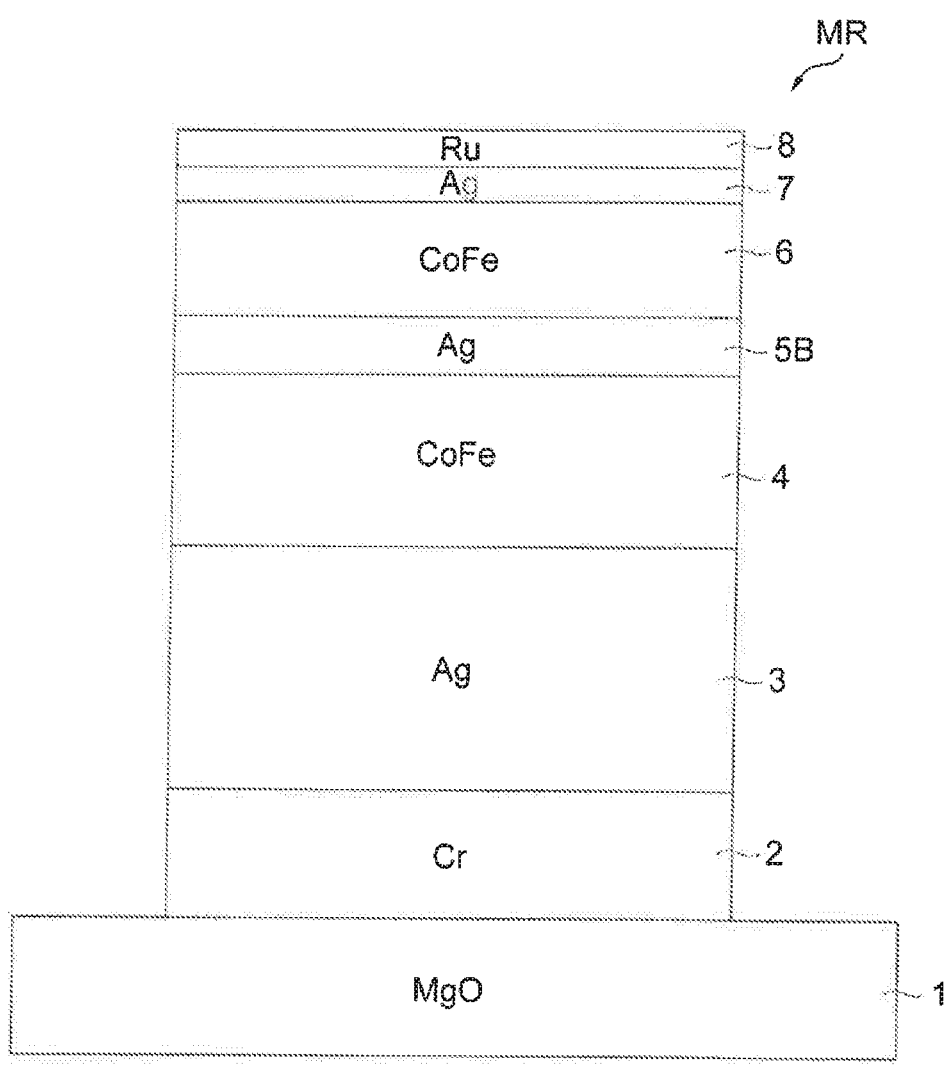
FIG. 2 is a front view of a magnetoresistive effect element MR according to a comparative example.

FIG. 2 is a front view of a magnetoresistive effect element MR according to a comparative example.

The magnetoresistive effect element according to the comparative example has a basic structure in which the insertion layers of an Fe alloy (the first insertion layer 5A and the second insertion layer 5C) are removed from the structure illustrated in FIG. 1, and the other structures thereof are the same as illustrated in FIG. 1 (the same as the structure of the exemplary example). In the comparative example, $Co_{0.5}Fe_{0.5}$ is used instead of CMS as the material of the first ferromagnetic layer 4 and the second ferromagnetic layer 6.

An MR ratio is used as an index for evaluating the performance of a magnetoresistive effect element. The MR ratio is given as

[(resistance value of element when magnetization direction is antiparallel−resistance value of element when magnetization direction is parallel)/ resistance value of element when magnetization direction is parallel].

The MR ratios in subsequent examples are standardized with respect to the MR ratio in this comparative example (comparative example 1 in FIG. 5) as a reference (=1).

Figure 4:
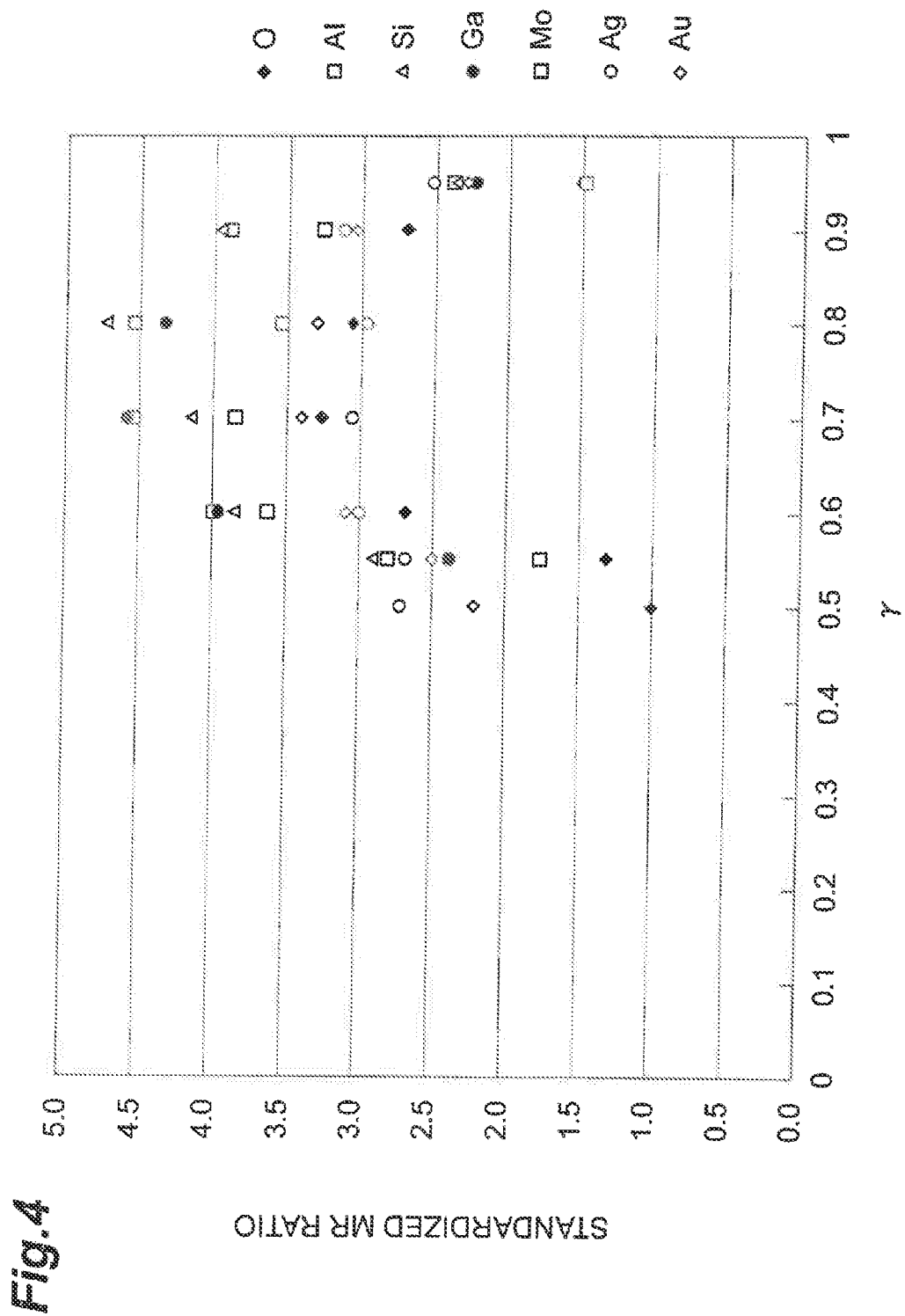
FIG. 4 is a graph in which data illustrated in FIG. 3 is plotted.

FIG. 3 is a table illustrating a relationship between the content of Fe γ in an insertion layer formed of $Fe_\gamma X_{1-\gamma}$ and the standardized MR ratio in the structure of the embodiment (the structure in the exemplary embodiment), and FIG. 4 is a graph in which data illustrated in FIG. 3 are plotted.

FIGS. 3 and 4 illustrate results when $Co_{0.5}Fe_{0.5}$ is used for the first ferromagnetic layer 4 and the second ferromagnetic layer 6 in the structure in the embodiment illustrated in FIG. 1, and the standardized MR ratio is equal to or greater than 1 irrespective of which one of O, Al, Si, Ga, Mo, Ag, and Au is used as the X element of $Fe_\gamma X_{1-\gamma}$. It can be seen that γ in General formula (1) ($Fe_\gamma X_{1-\gamma}$) preferably satisfies $0.6 \leq \gamma \leq 0.9$. When γ is in this range, the standardized MR ratio is equal to or greater than 2.7 and equal to or less than 4.7 and is much greater than the MR ratio in the comparative example.

In this way, when the content of Fe in the Fe alloy is in the range ($0.6 \leq \gamma \leq 0.9$), the MR ratio is higher than that when the content of Fe is outside of this range.

FIG. 5 is a table illustrating the standardized MR ratio and the like in GMR elements (the comparative example and Examples 1 to 5) when various materials are used.

As Comparative example 1, the above-mentioned comparative example (the example in which $Co_{0.5}Fe_{0.5}$ is used for the first ferromagnetic layer 4 and the second ferromagnetic layer 6) is illustrated, and the standardized MR ratio is obtained by standardization with the MR ratio at that time as 1. In Comparative example 1, when CMS ($Co_2Mn_{1.0}Si_{0.92}$) is used as the material of the first ferromagnetic layer 4 and the second ferromagnetic layer 6, the standardized MR ratio is 4.8.

Example 1 is an example in which $Co_{0.5}Fe_{0.5}$ is used for the first ferromagnetic layer 4 and the second ferromagnetic layer 6 and $Fe_{0.2}Au_{0.8}$ with a thickness of 0.5 nm is used for the first insertion layer 5A and the second insertion layer 5C in the structure illustrated in FIG. 1. The other materials and structures are the same as in the exemplary embodiment illustrated in FIG. 1.

Example 2 is an example in which $Co_{0.5}Fe_{0.5}$ is used for the first ferromagnetic layer 4 and the second ferromagnetic layer 6 and $Fe_{0.65}Au_{0.35}$ with a thickness of 0.5 nm is used for the first insertion layer 5A and the second insertion layer 5C in the structure illustrated in FIG. 1. The other materials and structures are the same as in the exemplary embodiment illustrated in FIG. 1.

Example 3 is an example in which $Co_2Mn_{1.0}Si_{0.92}$ is used for the first ferromagnetic layer 4 and the second ferromagnetic layer 6 and $Fe_{0.65}Au_{0.35}$ with a thickness of 0.5 nm is used for the first insertion layer 5A and the second insertion layer 5C in the structure illustrated in FIG. 1. The other materials and structures are the same as in the exemplary embodiment illustrated in FIG. 1.

Example 4 is an example in which $Co_2Mn_{1.0}Si_{0.92}$ is used for the first ferromagnetic layer 4 and the second ferromagnetic layer 6 and $Fe_{0.75}Al_{0.25}$ with a thickness of 0.5 nm is used for the first insertion layer 5A and the second insertion layer 5C in the structure illustrated in FIG. 1. The other materials and structures are the same as in the exemplary embodiment illustrated in FIG. 1.

Example 5 is an example in which $Co_2Mn_{1.3}Si_{0.92}$ is used for the first ferromagnetic layer 4 and the second ferromagnetic layer 6 and $Fe_{0.75}Al_{0.25}$ with a thickness of 0.5 nm is used for the first insertion layer 5A and the second insertion layer 5C in the structure illustrated in FIG. 1. The other materials and structures are the same as in the exemplary embodiment illustrated in FIG. 1.

The magnitude of the standardized MR ratio in Comparative example 1 is the smallest, and the standardized MR ratio in Example 1 using an insertion layer is larger than the standardized MR ratio in Comparative example 1. It can be seen that the MR ratio is increased by using the insertion layer.

In comparison with Example 1, the standardized MR ratio is larger in Example 2 in which the content of Fe ($\gamma=0.65$) in the insertion layer has increased. Accordingly, it is preferable that $0.65 \leq \gamma$ is satisfied in $Fe_\gamma X_{1-\gamma}$. Even with $0.6 \leq \gamma$, there is an effect of an increased MR ratio. This is because the first insertion layer and/or the second insertion layer can easily adopt a cubic crystal structure and thus the nonmagnetic spacer layer and the first ferromagnetic layer and/or the second ferromagnetic layer can be stacked with a higher crystal quality, whereby a larger magnetoresistive effect is exhibited. With $0.65 \leq \gamma$, a more stable cubic crystal structure can be adopted.

In comparison with Example 2, the standardized MR ratio is larger in Example 3 in which the type of the ferromagnetic layer has been changed to a Heusler alloy ($Co_2MnSi$).

In comparison with Example 3, the standardized MR ratio is larger in Example 4 in which the material of the insertion layer has been changed from Au to Al.

In comparison with Example 4, the standardized MR ratio is larger in Example 5 in which the content of Mn in the ferromagnetic layer is set to be larger.

When $Co_2L_\alpha M_\beta$ is used for the first ferromagnetic layer 4 and the second ferromagnetic layer 6, L in the formula denotes one or more elements from Mn and Fe and M denotes one or more elements selected from the group consisting of Si, Al, Ga, and Ge. Values of $\alpha+\beta$, $\alpha$(Mn) of Mn, and $\beta$(Si) of Si are also illustrated in FIG. 5.

FIG. 6 is a table illustrating the standardized MR ratios and the like in GMR effect elements (Example A group) when various materials are used.

Example A group is an example in which $Co_2Mn_\alpha Si_\beta$ is used for the first ferromagnetic layer 4 and the second ferromagnetic layer 6 and $Fe_{0.75}Al_{0.25}$ with a thickness of 0.5 nm is used for the first insertion layer 5A and the second insertion layer 5C in the structure illustrated in FIG. 1. The other materials and structures are the same as illustrated in FIG. 1. In Example A group, $\alpha$ changes from 0.45 to 1.75 and $\beta$ is fixed to 0.95.

FIG. 7 is a table illustrating the standardized MR ratios and the like in GMR effect elements (Example B group) when various materials are used.

Example B group is an example in which $Co_2Mn_\alpha Si_\beta$ is used for the first ferromagnetic layer 4 and the second ferromagnetic layer 6 and $Fe_{0.75}Al_{0.25}$ with a thickness of 0.5 nm is used for the first insertion layer 5A and the second insertion layer 5C in the structure illustrated in FIG. 1. The other materials and structures are the same as illustrated in FIG. 1. In Example B group, $\alpha$ is fixed to 1.3 and $\beta$ changes from 0.55 to 1.45.

Figure 8:
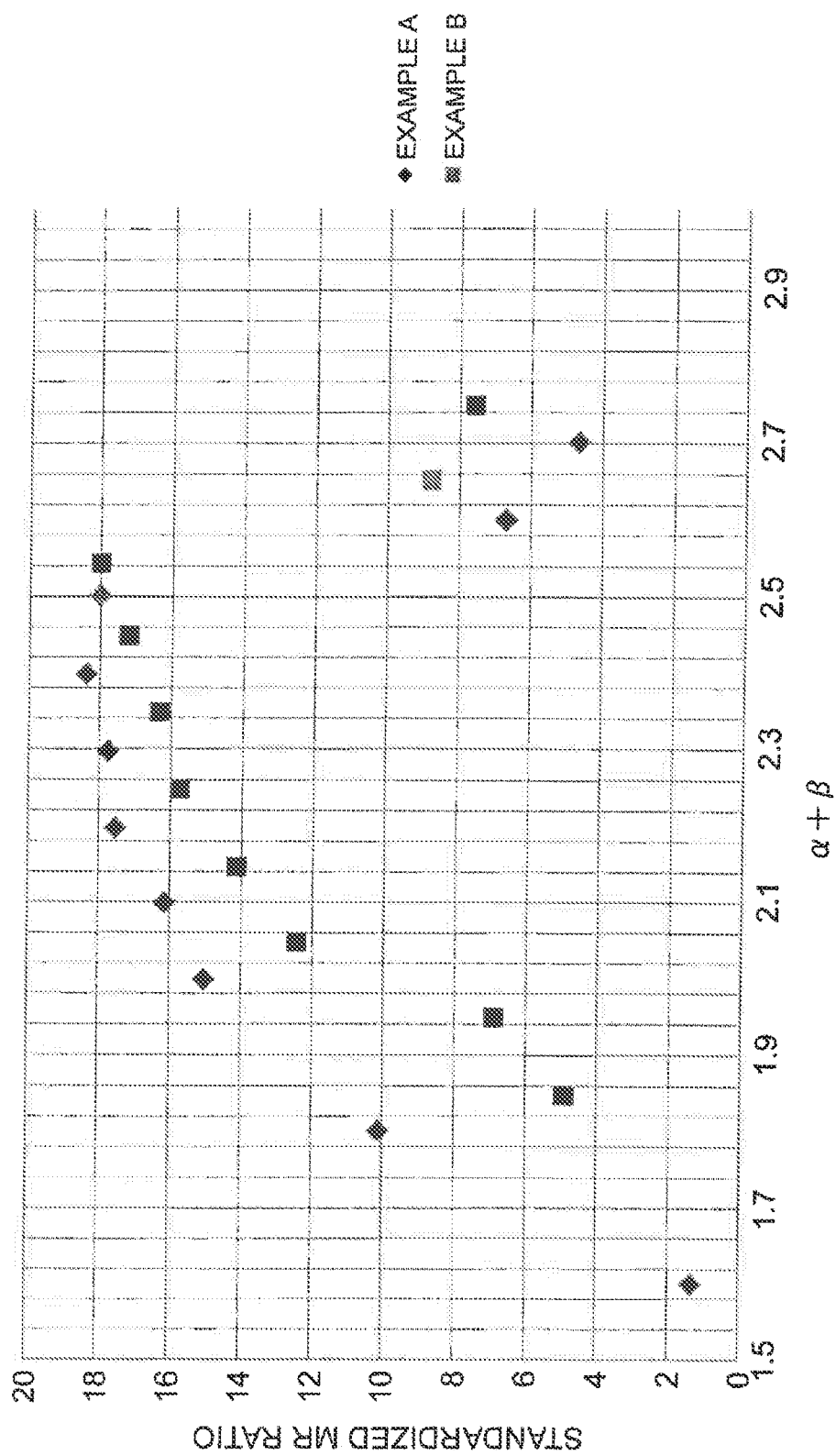
FIG. 8 is a graph illustrating a relationship between a sum ($\alpha+\beta$) of contents of elements other than Co in a ferromagnetic layer and a standardized MR ratio when materials of Example A group and Example B group are used.

FIG. 8 is a graph illustrating a relationship between the sum ($\alpha+\beta$) of the contents of elements other than Co in the ferromagnetic layer and the standardized MR ratios when the materials of Example A group and Example B group are used.

When L in General formula (2): ($Co_2L_\alpha M_\beta$) is set to Mn, M is set to Si, and $2 \leq \alpha+\beta \leq 2.6$ is satisfied, a high MR ratio can be obtained. In Example A, the MR ratio increases when $\alpha+\beta$ is equal to or greater than 2. In Example A group, when $\alpha+\beta$ reaches 2.6, the MR ratio has a value which is less than that when $\alpha+\beta$ is equal to 2.5 and greater than that when $\alpha+\beta$ is equal to or greater than 2.7. When $2 \leq \alpha+\beta \leq 2.55$ and $2 \leq \alpha+\beta \leq 2.5$ are satisfied, the MR ratio becomes greater.

Even in combinations of elements other than the case in which L is Mn and M is Si, defects in which a Co atom occupies an L site or an M site are minimized. It is thought that the same relationships are established for the reason that half metal characteristics of the first ferromagnetic layer 4 and the second ferromagnetic layer 6 are not impaired.

Particularly, when L in General formula (2): ($Co_2L_\alpha M_\beta$) of the ferromagnetic layer denotes one or more elements selected from the group consisting of Mn and Fe and M denotes one or more elements selected from the group consisting of Si, Al, Ga, and Ge, the lattice constants of ferromagnetic layer/Fe alloy/Ag or values of the square roots thereof can become close to each other as illustrated in FIGS. 15 and 16 which will be described later and it is thus considered that the MR ratio will be able to be increased.

The first ferromagnetic layer 4 and the second ferromagnetic layer 6 are both Heusler alloys which are expressed by General formula (2): $(Co_2L_\alpha M_\beta)$. It is thought that the increase in the MR ratio also results from lattice matching, and when at least one of the first ferromagnetic layer 4 and the second ferromagnetic layer 6 satisfies the conditions described in the examples, it is thought that an increase in MR ratio will be caused.

Since the increase in the MR ratio also results from lattice matching, it is considered that an increase in the MR ratio is caused when at least one of the first insertion layer 5A and the second insertion layer 5C satisfies the conditions described in the examples.

Figure 9:
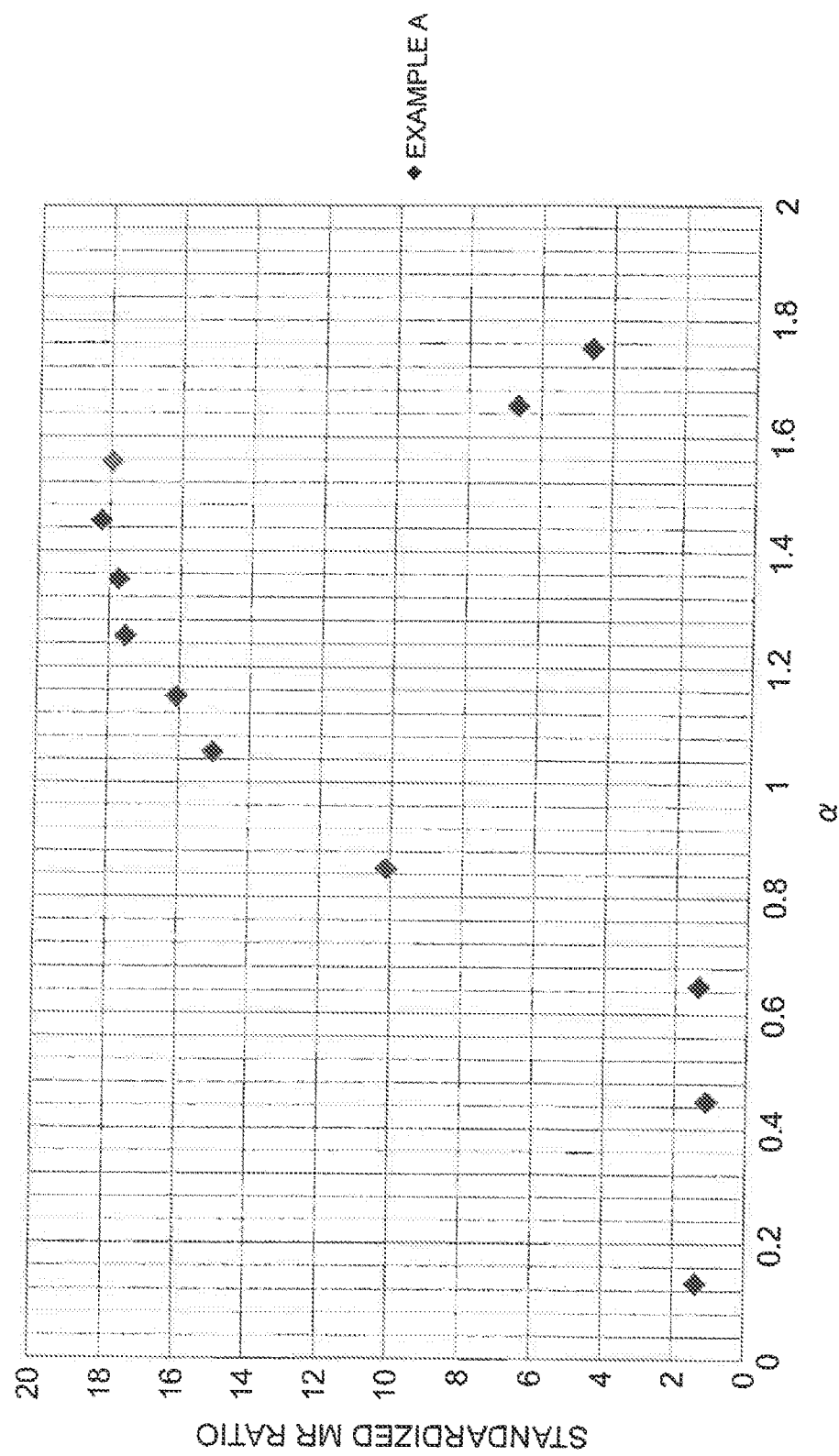
FIG. 9 is a graph illustrating a relationship between a content $\alpha$ of an L element in a ferromagnetic layer and a standardized MR ratio when materials of Example A group are used.

FIG. 9 is a graph illustrating a relationship between the content of element L $\alpha$ in the ferromagnetic layer and the standardized MR ratio when the materials of Example A group are used.

In Example A group, $\alpha$ changes in the range of 0.45 to 1.75. When $\alpha$ is equal to or greater than 0.85, the MR ratio increases rapidly. When $\alpha$ is equal to 0.65, the MR ratio does not have a large value but is greater than that when $\alpha$ has a lower value. Accordingly, when $\alpha \leq 0.65$ is satisfied, $\alpha < 0.65$ is satisfied, and $\alpha$ is greater than 0.7 which is a median value between 0.65 and 0.85, the MR ratio is considered to be high. When $\alpha$ is equal to or less than 1.55, the MR ratio remains high. When $\alpha$ is equal to 1.65, the MR ratio does not have a large value but is greater than that when $\alpha$ has a greater value. Accordingly, $\alpha \leq 1.65$ is preferable, $\alpha < 1.65$ is more preferable, and the MR ratio is considered to be high when $\alpha$ is less than 1.6 which is a median value between 1.55 and 1.65, that is, when $\alpha \leq 1.55$ is satisfied. In this way, in at least the range of $0.7 \leq \alpha \leq 1.6$, the MR ratio is considered to be high.

That is, regarding the materials of the ferromagnetic layer, when L in General formula (2): $(Co_2L_\alpha M_\beta)$ denotes Mn and M denotes Si and when $0.65 \leq \alpha \leq 1.65$ is satisfied, a high MR ratio can be achieved. When $0.85 \leq \alpha \leq 1.55$ is satisfied, a higher MR ratio can be achieved. Even in combinations of elements other than the case in which L is Mn and M is Si, defects in which a Co atom occupies an L site or an M site are minimized. It is thought that the same relationships are established for the reason that half metal characteristics of the first ferromagnetic layer 4 and the second ferromagnetic layer 6 are not impaired. L denotes one or more elements selected from the group consisting of Mn and Fe, and the lattice constant when L includes two or more elements can approximately have, for example, a median value between the lattices constants of the elements. In consideration that an increase in the MR ratio also results from lattice matching, it is thought that the same effects would be able to be achieved even when two or more elements are used.

M denotes one or more elements selected from the group consisting of Si, Al, Ga, and Ge, and the lattice constant when L includes two or more elements can approximately have, for example, a median value of the lattices constants of the elements. In consideration that an increase in the MR ratio also results from lattice matching, it is thought that the same effects would be able to be achieved even when two or more elements are used for M.

Figure 10:
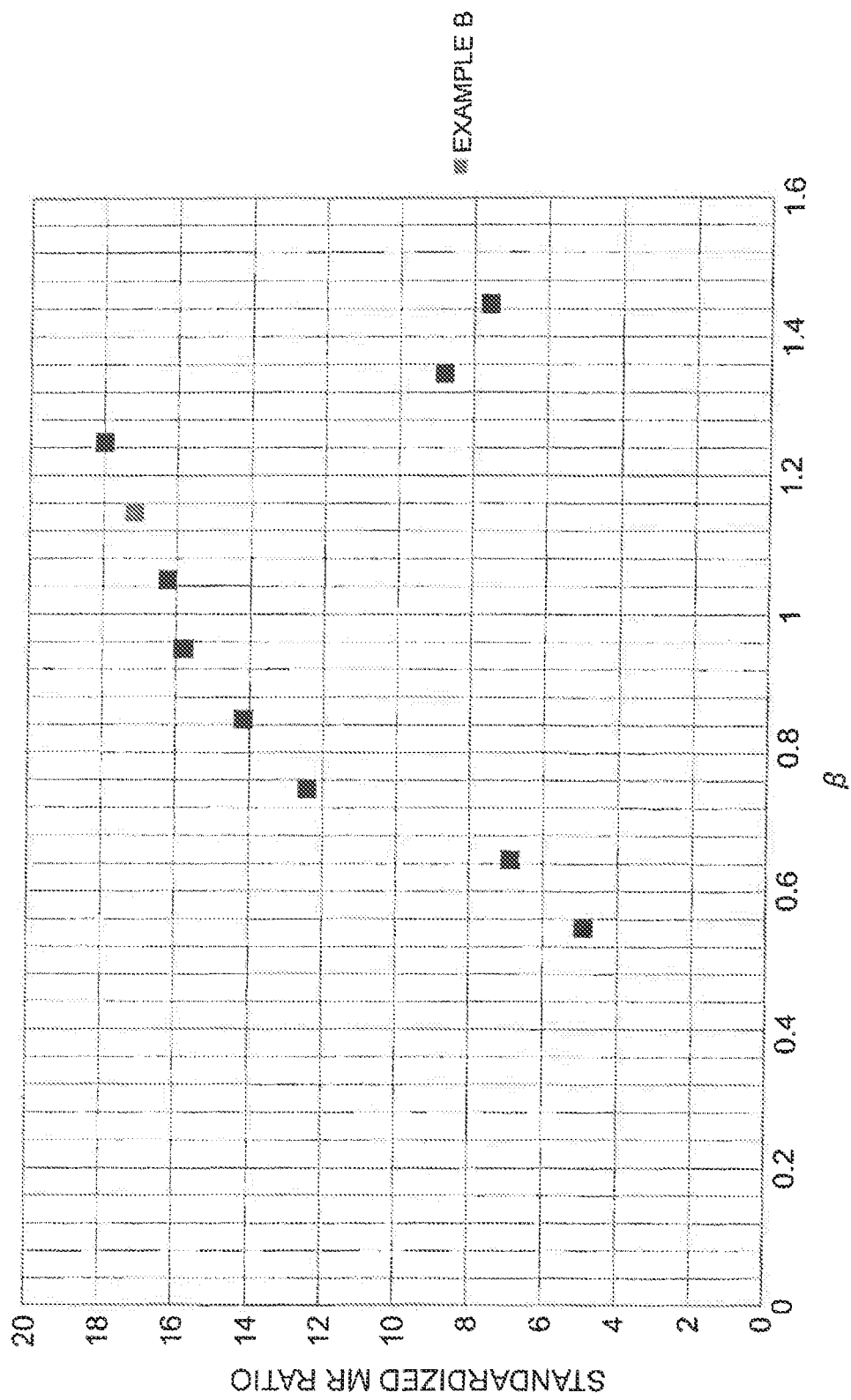
FIG. 10 is a graph illustrating a relationship between a content $\beta$ of an M element in a ferromagnetic layer and a standardized MR ratio when materials of Example B group are used.

FIG. 10 is a graph illustrating a relationship between the content of element M $\beta$ in the ferromagnetic layer and the standardized MR ratio when the materials of Example B group are used.

In Example B group, $\beta$ changes in the range of 0.55 to 1.45. When $\beta$ is equal to or greater than 0.75, the MR ratio increases rapidly. When $\beta$ is equal to 0.65, the MR ratio does not have a large value but is greater than that when $\beta$ has a lower value. Accordingly, $0.65 \leq \beta$ is preferable, $0.65 \leq \beta$ is more preferable, it is still more preferable that $\beta$ is greater than 0.7 which is a median value between 0.65 and 0.85, and $0.75 \leq \beta$ is still more preferable, whereby it is considered that the MR ratio will be high. When $\beta$ is equal to or less than 1.25, the MR ratio remains at a large value. When $\beta$ is equal to 1.35, the MR ratio does not have a large value but the MR ratio is greater than that when $\beta$ is greater. Accordingly, $\beta \leq 1.35$ is preferable, $\beta < 1.35$ is more preferable, $\beta < 1.3$ which is a median value between 1.25 and 1.35 is still more preferable, and $\beta \leq 1.25$ is still more preferable, whereby the MR ratio increases.

That is, regarding the materials of the ferromagnetic layer, when L in General formula (2): $(Co_2L_\alpha M_\beta)$ denotes Mn and M denotes Si and when $0.65 \leq \beta \leq 1.35$ is satisfied, a high MR ratio can be achieved.

As described above, from the viewpoint of an increase in the MR ratio, $0.65 \leq \alpha \leq 1.65$ is preferable, and $0.65 < \alpha$, $0.7 < \alpha$, and $0.85 \leq \alpha$ are preferable regarding the lower limit. Regarding the upper limit, in comparison with $\alpha \leq 1.65$, $\alpha < 1.65$, $\alpha < 1.6$, and $\alpha \leq 1.55$ are more preferable. From the viewpoint of an increase in the MR ratio, $0.65 \leq \beta \leq 1.35$ is preferable, and $0.65 < \beta$, $0.7 < \beta$, and $0.75 \leq \beta$ are more preferable regarding the lower limit. Regarding the upper limit, in comparison with $\alpha \leq 1.35$, $\beta < 1.35$, $\beta < 1.3$, and $\beta \leq 1.25$ are more preferable.

Even in combinations of elements other than the case in which L is Mn and M is Si, defects in which a Co atom occupies an L site or an M site are minimized. It is thought that the same relationships are established for the reason that half metal characteristics of the first ferromagnetic layer 4 and the second ferromagnetic layer 6 are not impaired.

Figure 12:
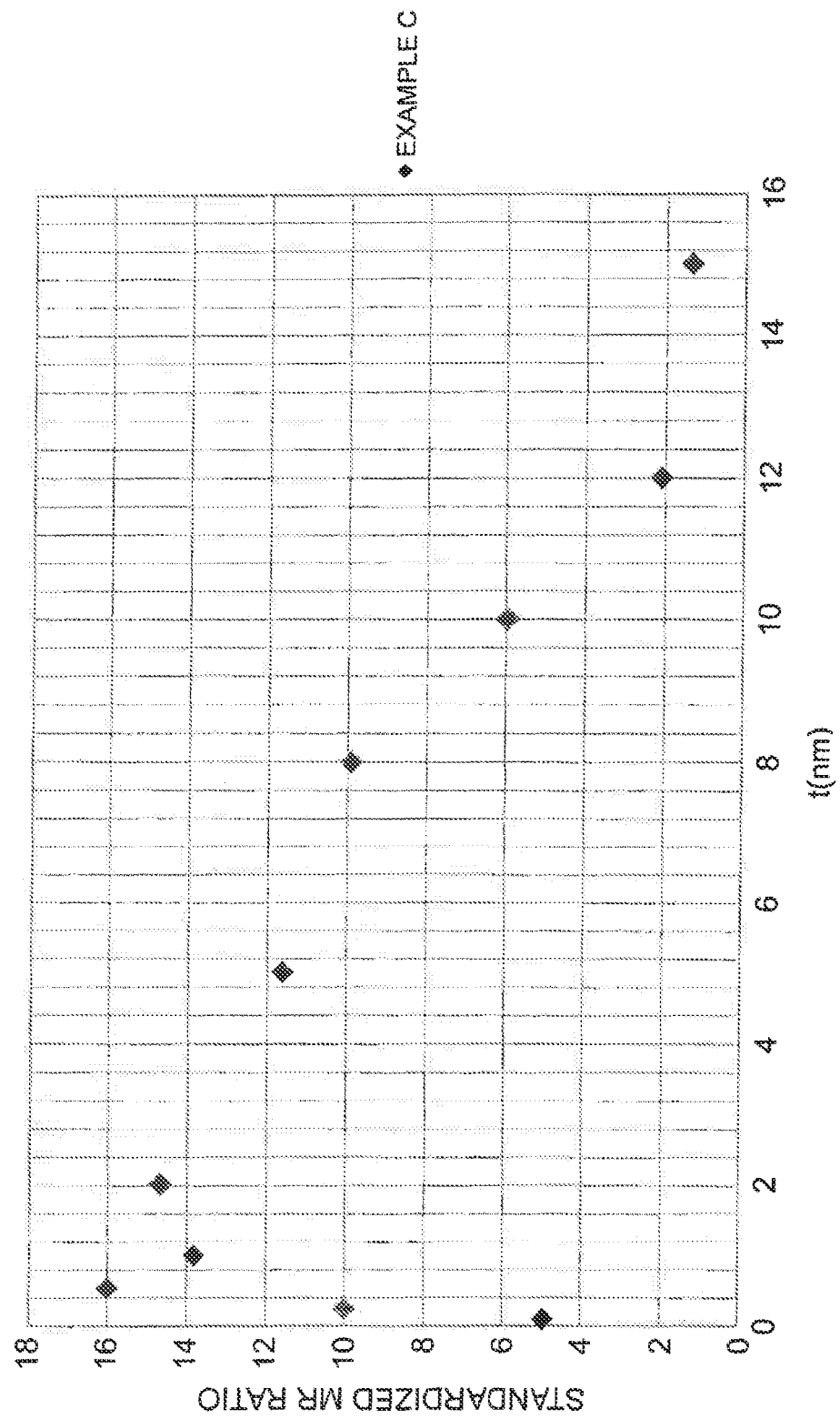
FIG. 12 is a graph illustrating a relationship between a thickness of an insertion layer and a standardized MR ratio when materials of Example C group are used.

FIG. 11 is a table illustrating the thickness of the insertion layer, the standardized MR ratio, and the like when the materials of Example C group are used, and FIG. 12 is a graph illustrating a relationship between the thickness of the insertion layer and the standardized MR ratio when the materials of Example C group are used.

Example C group is an example in which $Co_2Mn_{1.3}Si_{0.92}$ is used for the first ferromagnetic layer 4 and the second ferromagnetic layer 6 and $Fe_{0.75}Al_{0.25}$ with a thickness of t (nm) is used for the first insertion layer 5A and the second insertion layer 5C in the structure illustrated in FIG. 1. The other materials and structures are the same as illustrated in FIG. 1. In Example C group, $\alpha$ is fixed to 1.3 and $\beta$ is fixed to 0.92.

The thicknesses t of two insertion layers change in the range of 0.1 nm to 15 nm. The MR ratio increases when the thickness t of the insertion layer is equal to or greater than 0.2 nm, and the MR ratio when the thickness t of the insertion layer is equal to or less than 10 nm is several numerical stages greater than the MR ratio when the thickness is 12 nm. Accordingly, $0.2 \text{ nm} \leq t1 \leq 10 \text{ nm}$ should be satisfied where t1 denotes the thickness of the first insertion layer 5A, and $0.2 \text{ nm} \leq t2 \leq 10 \text{ nm}$ should be satisfied where t2 denotes the thickness of the second insertion layer 5C. In this case, a high MR ratio can be achieved.

Regarding the thicknesses t (t1 and t2) of the insertion layers, $0.2 \text{ nm} \leq t \leq 8 \text{ nm}$ is more preferable ($0.2 \text{ nm} \leq t1 \leq 8 \text{ nm}$ and $0.2 \text{ nm} \leq t2 \leq 8 \text{ nm}$). In the ranges of $0.2 \text{ nm} < t1$ and $0.2 \text{ nm} < t2$, since the thicknesses are equal to or greater than a unit lattice in a crystal structure, a film with a layer shape can be easily formed. $0.5 \text{ nm} \leq t1 \leq 8 \text{ nm}$ is more preferable ($0.5 \text{ nm} \leq t1 \leq 8 \text{ nm}$ and $0.5 \text{ nm} \leq t2 \leq 8 \text{ nm}$). In this case, a high MR ratio can be achieved.

The lattice constants of the layers will be described below.

FIG. 13 is a table illustrating lattice constants, structure types, and Pearson symbols of Ag and Fe alloys.

The nonmagnetic metal layer 5B illustrated in FIG. 1 is formed of Ag and the first insertion layer 5A and the second insertion layer 5C are formed of $Fe_\gamma X_{1-\gamma}$, where X is selected from the group consisting of O, Al, Si, Ga, Mo, Ag, and Au. X may include one element or two or more elements (X1 and X2) among these elements. In the latter case, the lattice constant can approximately have, for example, a median value between the lattice constant when X1 is used and the lattice constant when X2 is used.

$Fe_\gamma X_{1-\gamma}$ denotes an Fe alloy and thus $\gamma$ is in the range of $0<\gamma<1$.

In FIG. 13, the lattice constants a of $Fe_{0.5}O_{0.5}$, $Fe_{0.1}Al_{0.9}$, $Fe_{0.75}Al_{0.25}$, $Fe_{0.75}Si_{0.25}$, $Fe_{0.75}Ga_{0.25}$, $Mo_{0.73}Fe_{0.27}$, $Ag_{0.5}Fe_{0.5}$, and $Au_{0.5}Fe_{0.5}$, square roots thereof, structure types of crystals, and Pearson symbols thereof are illustrated. When the insertion layers (5A and 5C) grow while rotating by 45° with respect to the vertical crystal axes of the neighboring ferromagnetic layers (4, and 6), a value obtained by multiplying a by a square root of 2 approaches the lattice constant of the ferromagnetic layer. The mark (*) in the figure denotes a value which approaches the lattice constants of the ferromagnetic layers (4 and 6), and a marked by (*) or a value obtained by multiplying a by a square root of 2 is selected for lattice matching.

FIG. 14 is a table illustrating the lattice constants of the ferromagnetic layers (4 and 6) (various Heusler alloys).

In the figure, the lattice constants a of $Co_2MnSi$, $Co_2MnGe$, $Co_2MnGa$, $Co_2FeGa$, $Co_2FeSi$, $Co_2MnSn$, $Co_2MnAl$, $Co_2FeAl$, $Co_2CrAl$, $Co_2VAl$, $Co_2MnGa_{0.5}Sn_{0.5}$, and $Co_2FeGeGa$ are illustrated. FIGS. 15 and 16 are tables illustrating lattice mismatching ratios between Ag (the nonmagnetic metal layer) or Fe alloys (the insertion layers) illustrated in FIG. 13 and various Heusler alloys (the ferromagnetic layer) illustrated in FIG. 14.

Lattice mismatching ratio=[(lattice constant a of Ag or insertion layer or value obtained by multiplying a by square root of 2–lattice constant of ferromagnetic layer)/lattice constant of ferromagnetic layer]

In combinations of the materials, when the lattice mismatching ratio is small, the MR ratio can be set to be large. Specifically, the MR ratio can be increased by providing an Fe alloy (the insertion layer) in which the lattice mismatching ratio is less than the lattice mismatching ratio between Ag (the nonmagnetic metal layer) and various Heusler alloys (the ferromagnetic layer), and the MR ratio can be further increased by providing an Fe alloy (the insertion layer) in which the lattice mismatching ratio between Ag (the nonmagnetic metal layer) and various Heusler alloys (the ferromagnetic layer) can be increased by 0.5% or more. However, since the stacking is stacking between dissimilar materials, the absolute value of the lattice mismatching ratio is greater than zero. The lattice constant refers to a value at room temperature (300 K).

Figure 17:
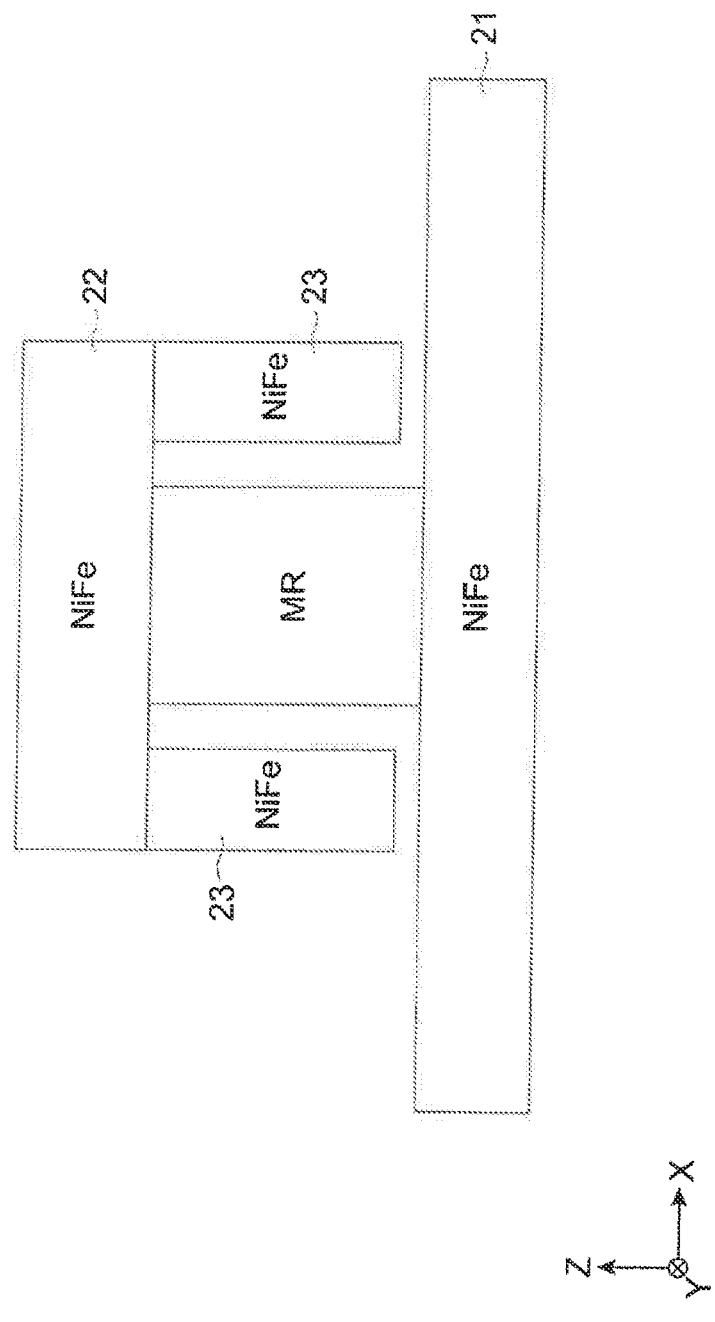
FIG. 17 is a diagram illustrating a sectional configuration of a reproduction unit of a magnetic head including a magnetoresistive effect element.

FIG. 17 is a diagram illustrating a sectional configuration of a reproduction unit of a magnetic head including a magnetoresistive effect element.

The magnetic head includes the magnetoresistive effect element MR illustrated in FIG. 1. Specifically, the magnetic head includes a lower magnetic shield 21, a magnetoresistive effect element MR that is fixed to the lower magnetic shield, an upper magnetic shield 22 that is fixed to the top of the magnetoresistive effect element MR, and a side magnetic shield 23 that is fixed to the side of the upper magnetic shield 22. The magnetic shields are formed of NiFe or the like. The magnetic head having such a structure is known and an example thereof is described in U.S. Pat. No. 5,695,697, which can be referred to.

Figure 18:
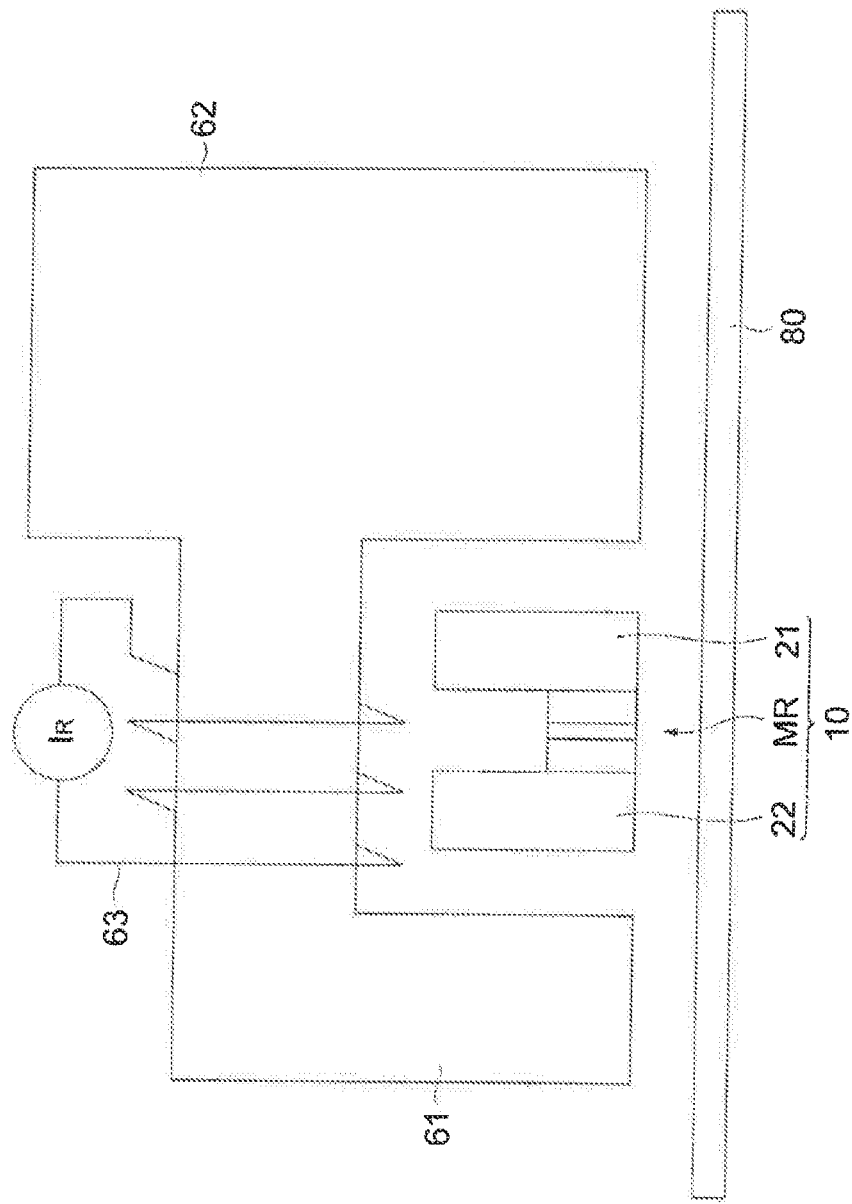
FIG. 18 is a diagram illustrating a sectional configuration of a magnetic head including a magnetoresistive effect element.

FIG. 18 is a diagram illustrating a sectional configuration of a magnetic recording head including a magnetoresistive effect element MR.

The magnetic recording head includes a main magnetic pole 61, a circulation magnetic pole 62, and a spin torque oscillator (an oscillator) 10 that is disposed in parallel with the main magnetic pole 61. The spin torque oscillator 10 has the same structure as the above-mentioned magnetic head, that is, a structure in which the lower magnetic shield 21 and the upper magnetic shield 22 are disposed as electrodes on the top and bottom of the magnetoresistive effect element MR.

Since a coil 63 is wound on a base end portion of the main magnetic pole 61, a writing magnetic field is generated around the main magnetic pole 61 when a driving current is supplied to a current source $I_R$. The generated magnetic field passes through the magnetic poles to form a closed magnetic circuit.

When a DC current flows across the upper and lower electrodes of the spin torque oscillator 10 including the magnetoresistive effect element MR, ferromagnetic resonance is generated due to a spin torque generated in a spin injection layer, and a high-frequency magnetic field is generated from the spin torque oscillator 10. High-density magnetic recording is performed on a magnetic recording medium 80 facing the magnetic fields only in a portion in which the recording magnetic field resulting from the main magnetic pole 61 and the high-frequency magnetic field resulting from the spin torque oscillator 10 overlap each other. A magnetic recording head having such a structure is known and an example thereof is described in Japanese Patent No. 5173750, which can be referred to.

Figure 19:
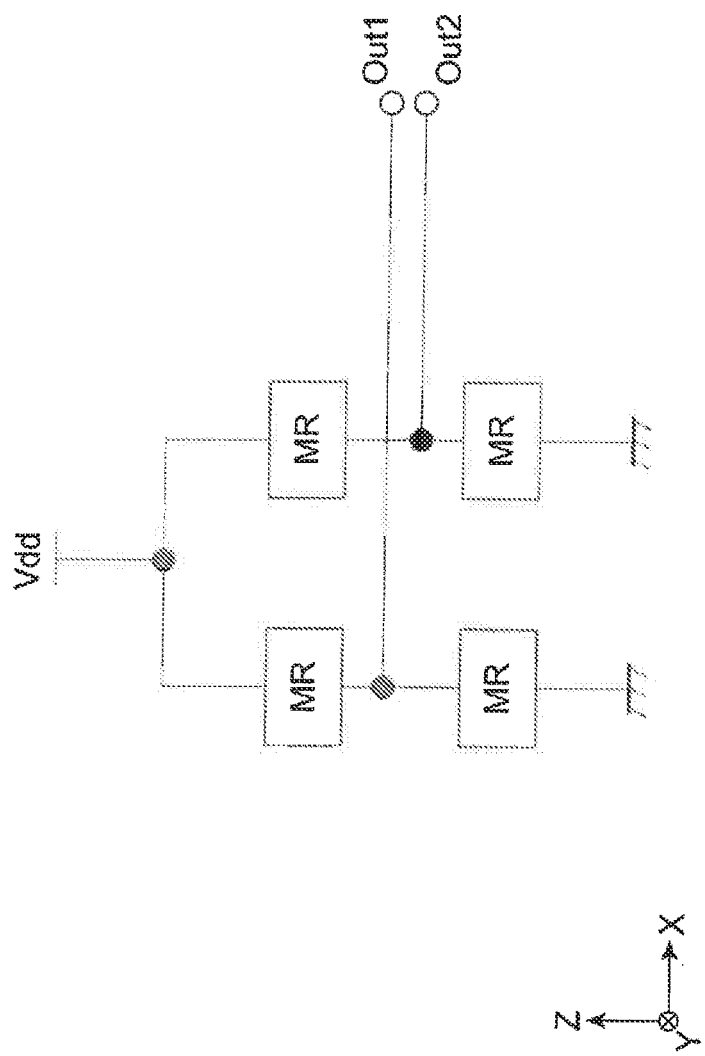
FIG. 19 is a diagram illustrating a structure of a current sensor including a plurality of magnetoresistive effect elements.

FIG. 19 is a diagram illustrating a structure of a current sensor including a plurality of magnetoresistive effect elements.

The current sensor is configured as a bridge circuit in which a plurality of magnetoresistive effect elements MR are electrically connected. In the drawing, a bridge circuit is configured by four magnetoresistive effect elements MR, and two circuit arrays in which two magnetoresistive effect elements MR are connected in series are connected in parallel between the ground potential and the source potential Vdd. Junction points between two magnetoresistive effect elements MR in the circuit arrays serve as a first output terminal Out1 and a second output terminal Out2, and a voltage therebetween is an output signal.

When it is assumed that a wire to be measured extends in the Z axis direction, a magnetic field is generated around the wire and resistance values of the magnetoresistive effect elements MR vary depending on the magnitude of the magnetic field. Since the intensity of the output signal depends on the magnitude of the magnetic field, that is, an amount of current flowing in the wire, this device can function as a current sensor. This device also functions directly as a magnetic sensor that detects the magnitude of the magnetic field.

Figure 20:
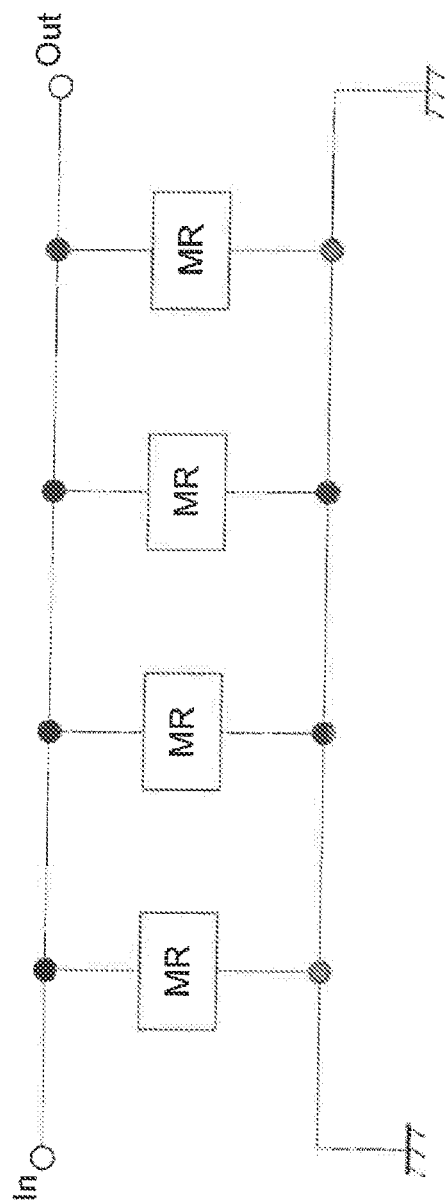
FIG. 20 is a diagram illustrating a structure of a high-frequency filter including a plurality of magnetoresistive effect elements.

FIG. 20 is a diagram illustrating a structure of a high-frequency filter including a plurality of magnetoresistive effect elements.

The high-frequency filter has a structure in which a plurality of magnetoresistive effect elements MR are electrically connected in parallel. That is, upper electrodes (shield electrodes or contact electrodes) of the magnetoresistive effect elements MR are connected or made common and lower electrodes (shield electrodes or first nonmagnetic metal layers) of the magnetoresistive effect elements MR are connected or made common.

A plurality of magnetoresistive effect elements MR have different horizontal sectional areas (sectional areas in the XY plane) and thus have different resonance frequencies. When a high-frequency signal is input from an input terminal In, each magnetoresistive effect element MR absorbs a signal component of the same frequency as the resonance frequency thereof in the input high-frequency signal, and the remaining high-frequency signal component is output from an output terminal Out. Accordingly, this device functions as a high-frequency filter. A device having such a structure is known and an example thereof is described in PCT International Publication No. WO2011/033664, which can be referred to.

The magnetoresistive effect element illustrated in FIG. 1 can be manufactured as follows.

First, the first nonmagnetic metal layer 2, the second nonmagnetic metal layer 3, the first ferromagnetic layer 4, the nonmagnetic spacer layer 5, the second ferromagnetic layer 6, the cap nonmagnetic metal layer 7, and the contact metal layer 8 are sequentially deposited on the first base layer 1. The nonmagnetic spacer layer 5 is formed by depositing the first insertion layer 5A, the nonmagnetic metal layer 5B, and the second insertion layer 5C on the first ferromagnetic layer 4.

A sputtering method which is a known technique is used for this deposition. In this example, the layers are formed by film formation at room temperature using sputtering targets formed of the materials of the layers and ultrahigh vacuum sputtering equipment, but two or more sputtering targets may be simultaneously used. That is, by simultaneously sputtering two (or more) targets of different materials A and B, the material contents of an alloy film of A and B or the layers can be adjusted. For example, an alloy film can be formed by sputtering an Fe target and a different metal target together (simultaneously). An FeO (oxygen) film can be formed by introducing oxygen gas into a deposition chamber of the sputtering equipment at the time of sputtering of Fe. Commercially available products can be used as the substrate material, and MgO which is a commercially available product is used as the first base layer. The first ferromagnetic layer 4 is annealed at 500° C. after deposition. The second ferromagnetic layer 6 is annealed at 450° C. after deposition. The magnetoresistive effect element is microfabricated into a shape in which magnetoresistive characteristics can be evaluated by electron beam lithography and Ar ion milling. A method of manufacturing CMS or the like using sputtering equipment is described, for example, in U.S. Patent Application Publication No. 2007/0230070, U.S. Patent Application Publication No. 2013/0229895, U.S. Patent Application Publication No. 2014/0063648, U.S. Patent Application Publication No. 2007/0211391, and U.S. Patent Application Publication No. 2013/0335847.

As described above, with a magnetoresistive effect element satisfying General formula (1) and/or General formula (2), it is possible to achieve a high MR ratio. With a magnetic head, a sensor, a high-frequency filter, or an oscillator including the above-mentioned magnetoresistive effect element, an excellent magnetresistive effect is provided. Accordingly, they can exhibit excellent characteristics based thereon.

The first insertion layer and/or the second insertion layer can have a stable cubic crystal structure. As a result, since the nonmagnetic spacer layer and the first ferromagnetic layer and/or the second ferromagnetic layer can be stacked with a higher crystal quality, it is possible to exhibit a better magnetoresistive effect.

Since $\alpha$ and $\beta$ satisfy the above-mentioned ranges, the Heusler alloys of the first ferromagnetic layer and the second ferromagnetic layer have close lattice constants in stoichiometric compositions. As a result, it is possible to further reduce lattice mismatching between the first ferromagnetic layer and/or the second ferromagnetic layer and the nonmagnetic spacer layer and to exhibit a better magnetoresistive effect.

When an Fe alloy includes Al, Si, or Ga, it is possible to easily align magnetizable axis directions of the first insertion layer and/or the second insertion layer, the first ferromagnetic layer, and the second ferromagnetic layer. As a result, a magnetoresistive effect which is exhibited at a relative angle of magnetization between that of the first ferromagnetic layer and the second ferromagnetic layer can be maintained at a maximum. An FeX alloy is a magnetic material, but crystals can grow without rotating 45 degrees with respect to the Heusler alloy when X=Al, Si, or Ge.

When $\alpha+\beta$ is in the above-mentioned range, half metal characteristics of the Heusler alloys included in the first ferromagnetic layer and the second ferromagnetic layer can easily be maintained. As a result, it is possible to achieve a much better magnetoresistive effect.

When the thickness of the first insertion layer is defined as t1 and the thickness of the second insertion layer is defined as t2, it is preferable that t1 and t2 be set to be equal to or less than a spin diffusion length of the materials $Fe_\gamma X_{1-\gamma}$ of the insertion layers. Since a spin source in electrons which move from the first ferromagnetic layer to the second ferromagnetic layer is not affected by the first insertion layer and/or the second insertion layer, the magnetoresistive effect is enhanced. Specifically, when t1≤10 nm and/or t2≤10 nm in the above-mentioned ranges of the thicknesses t1 and t2, spin-scattering of electrons that move between the first ferromagnetic layer 4 and the second ferromagnetic layer 6 can be satisfactorily suppressed in the first insertion layer and/or the second insertion layer during the movement of elements and thus the magnetoresistive effect is particularly enhanced. When 0.2 nm≤t1 and/or 0.2 nm≤t2 are satisfied, the thicknesses of the first insertion layer and the second insertion layer are sufficiently large and thus it is possible to satisfactorily reduce lattice mismatching between the nonmagnetic spacer layer and the first ferromagnetic layer and/or the second ferromagnetic layer. As a result, since the nonmagnetic spacer layer and the first ferromagnetic layer 4 and/or the second ferromagnetic layer 6 are stacked with a high crystal quality, the magnetoresistive effect is particularly enhanced.

Since the behavior of the magnetoresistive effect element having the above-mentioned structure with respect to spin is thought to occur in the same way in a CIP-GMR effect element (a current-in-plane type GMR effect element) as well as in a CPP-GMR effect element in principle, the above-mentioned structure is also considered to be effective in a CIP-GMR effect element from the viewpoint of improvement in MR ratio. This is because the crystallinity of the first ferromagnetic layer and/or the second ferromagnetic layer and the nonmagnetic spacer layer is improved due to reduction of the lattice mismatching ratio and thus an excellent magnetoresistive effect can be achieved.

What is claimed is:

1. A magnetoresistive effect element comprising:
a first ferromagnetic layer;
a second ferromagnetic layer; and
a spacer layer that is disposed between the first ferromagnetic layer and the second ferromagnetic layer,
wherein the spacer layer includes:
a nonmagnetic layer, and
at least one of
a first insertion layer that is disposed on a bottom surface of the nonmagnetic layer and
a second insertion layer that is disposed on a top surface of the nonmagnetic layer, and
wherein the first insertion layer and the second insertion layer include an Fe alloy that is expressed by General Formula (1):

$$Fe_\gamma X_{1-\gamma} \qquad (1),$$

where X denotes one or more elements selected from a group consisting of O, Al, Si, Ga, Mo, Ag, and Au, and γ satisfies $0<\gamma<1$,
wherein at least one of the first ferromagnetic layer and the second ferromagnetic layer includes a Heusler alloy that is expressed by General formula (2):

$$Co_2L_\alpha M_\beta \qquad (2),$$

where L denotes one or more elements selected from a group consisting of Mn and Fe,
M denotes one or more elements selected from a group consisting of Si, Al, Ga, and Ge, $$0.7 \leq \alpha \leq 1.6, \text{ and}$$

$$0.65 \leq \beta,$$

wherein α and β in General formula (2) satisfy $2<\alpha+\beta$.

2. The magnetoresistive effect element according to claim 1, wherein
γ in General Formula (1) satisfies $0.6 \leq \gamma \leq 0.9$.

3. The magnetoresistive effect element according to claim 2, wherein X in General formula (1) is one or more elements selected from a group consisting of Al, Si, and Ga.

4. The magnetoresistive effect element according to claim 3, wherein α and β in General formula (2) satisfy:

$$0.85 \leq \alpha \leq 1.55, \text{ and}$$

$$0.75 \leq \beta \leq 1.25.$$

5. The magnetoresistive effect element according to claim 3,
wherein $0.2 \text{ nm} \leq t1 \leq 10 \text{ nm}$ is satisfied where t1 denotes a thickness of the first insertion layer, and
wherein $0.2 \text{ nm} \leq t2 \leq 10 \text{ nm}$ is satisfied where t2 denotes a thickness of the second insertion layer.

6. The magnetoresistive effect element according to claim 1, wherein α and β in General formula (2) satisfy:

$$0.85 \leq \alpha \leq 1.55, \text{ and}$$

$$0.75 \leq \beta \leq 1.25.$$

7. The magnetoresistive effect element according to claim 1,
wherein $0.2 \text{ nm} \leq t1 \leq 10 \text{ nm}$ is satisfied where t1 denotes a thickness of the first insertion layer, and
wherein $0.2 \text{ nm} \leq t2 \leq 10 \text{ nm}$ is satisfied where t2 denotes a thickness of the second insertion layer.

8. The magnetoresistive effect element according to claim 1,
wherein α and β in General formula (2) further satisfy $$\alpha+\beta \leq 2.75.$$

9. A magnetic head comprising the magnetoresistive effect element according to claim 1.

10. A sensor comprising the magnetoresistive effect element according to claim 1.

11. A magnetoresistive effect element comprising:
a first ferromagnetic layer;
a second ferromagnetic layer; and
a spacer layer that is disposed between the first ferromagnetic layer and the second ferromagnetic layer,
wherein the spacer layer includes:
a nonmagnetic layer, and at least one of
a first insertion layer that is disposed on a bottom surface of the nonmagnetic layer and
a second insertion layer that is disposed on a top surface of the nonmagnetic layer,
wherein the first insertion layer and the second insertion layer include an Fe alloy that is expressed by General Formula (1):

$$Fe_\gamma X_{1-\gamma} \qquad (1),$$

where X denotes one or more elements selected from a group consisting of Al, Ga and Ag, and
γ satisfies $0.6 \leq \gamma \leq 0.9$,
wherein the first insertion layer is continued from one side to the other side of the magnetoresistive effect element in a transverse direction of the magnetoresistive effect element,
wherein the second insertion layer is continued from one side to the other side of the magnetoresistive effect element in a transverse direction of the magnetoresistive effect element,
wherein at least one of the first ferromagnetic layer and the second ferromagnetic layer includes a Heusler alloy that is expressed by General formula (2):

$$Co_2L_\alpha M_\beta \qquad (2),$$

where L denotes one or more elements selected from a group consisting of Mn and Fe,
M denotes one or more elements selected from a group consisting of Si, Al, Ga, and Ge, $$1<\alpha,$$

$$0.65 \leq \beta, \text{ and}$$

$$2 \leq \alpha+\beta.$$

12. The magnetoresistive effect element according to claim 11,
wherein $0.2 \text{ nm} \leq t1 \leq 10 \text{ nm}$ is satisfied where t1 denotes a thickness of the first insertion layer, and
wherein $0.2 \text{ nm} \leq t2 \leq 10 \text{ nm}$ is satisfied where t2 denotes a thickness of the second insertion layer.

13. The magnetoresistive effect element according to claim 11,
wherein α and β in General formula (2) further satisfy $$\alpha+\beta \leq 2.75.$$

14. A magnetic head comprising the magnetoresistive effect element according to claim 11.

15. A sensor comprising the magnetoresistive effect element according to claim 11.

16. A magnetoresistive effect element comprising:
a first ferromagnetic layer;
a second ferromagnetic layer; and
a spacer layer that is disposed between the first ferromagnetic layer and the second ferromagnetic layer, wherein the spacer layer includes:
a nonmagnetic layer, and
at least one of
a first insertion layer that is disposed on a bottom surface of the nonmagnetic layer and
a second insertion layer that is disposed on a top surface of the nonmagnetic layer, and
wherein the first insertion layer and the second insertion layer include an Fe alloy that is expressed by General Formula (1):

$$Fe_\gamma X_{1-\gamma} \quad (1),$$

where X denotes one or more elements selected from a group consisting of Mo and Au, and
$\gamma$ satisfies $0.6 \leq \gamma \leq 0.9$, and
wherein at least one of the first ferromagnetic layer and the second ferromagnetic layer includes a Heusler alloy that is expressed by General formula (2):

$$Co_2L\alpha M\beta \quad (2),$$

where L denotes one or more elements selected from a group consisting of Mn and Fe, M denotes one or more elements selected from a group consisting of Si, Al, Ga, and Ge, $0.7 \leq \alpha - 1.6$, $0.65 \leq \beta$, and $2 < \alpha + \beta$.

17. The magnetoresistive effect element according to claim 16,
wherein $0.2$ nm$\leq t1 \leq 10$ nm is satisfied where t1 denotes a thickness of the first insertion layer, and
wherein $0.2$ nm$\leq t2 \leq 10$ nm is satisfied where t2 denotes a thickness of the second insertion layer.

18. The magnetoresistive effect element according to claim 16,
wherein $\alpha$ and $\beta$ in General formula (2) further satisfy $\alpha + \beta \leq 2.75$.

19. A magnetic head comprising the magnetoresistive effect element according to claim 16.

20. A sensor comprising the magnetoresistive effect element according to claim 16.

* * * * *